United States Patent [19]
Ozawa

[11] Patent Number: 5,825,248
[45] Date of Patent: Oct. 20, 1998

[54] LOW POWER CONSUMING BALANCED TRANSFORMER LESS AMPLIFIER DEVICE

[75] Inventor: Akio Ozawa, Tokyo, Japan

[73] Assignee: Pioneer Electronic Corporation, Tokyo, Japan

[21] Appl. No.: 736,609

[22] Filed: Oct. 24, 1996

[30] Foreign Application Priority Data

| Oct. 25, 1995 | [JP] | Japan | 7-300647 |
| Dec. 1, 1995 | [JP] | Japan | 7-338059 |
| Jan. 18, 1996 | [JP] | Japan | 8-024562 |
| Apr. 27, 1996 | [JP] | Japan | 8-131023 |

[51] Int. Cl.$^6$ ............................................ H03F 3/30
[52] U.S. Cl. .................... 330/267; 330/146; 330/295; 330/297
[58] Field of Search ........................... 330/202, 124 R, 330/146, 267, 273, 295, 297

[56] References Cited

U.S. PATENT DOCUMENTS 5,424,684  6/1995  Nishioka et al. ................ 330/297 X Primary Examiner—James B. Mullins
Attorney, Agent, or Firm—Fish & Richardson, P.C.

[57] ABSTRACT

The present invention provides a BTL amplifier device with low power consumption and high efficiency which comprises two units of amplifier, a transistor, and a load resistor, and is driven as claimed in output from an operational amplifier as well as from an inverting amplifier. Signals at both edges of the load resistor are supplied to a differential NFB circuit and a fed-back output is inputted to one of the operational amplifiers, while an output signal from the operational amplifier is converted by an absolute value circuit, and then a DC voltage is superimposed on the absolute value signal in a voltage shifting circuit. Voltage from a voltage divider for dividing an output voltage from the voltage shifting circuit and a power voltage to 1/ gain (G) of the two units of amplifier is supplied to a pulse width control circuit, which is compared to a signal from a triangular oscillator so that the pulse width control circuit supplies the compared voltage to a step-up chopper circuit having a pulse width as claimed in a difference between the two voltages, and the chopper supplies a power voltage according to the output voltage.

18 Claims, 26 Drawing Sheets

FIG. 10
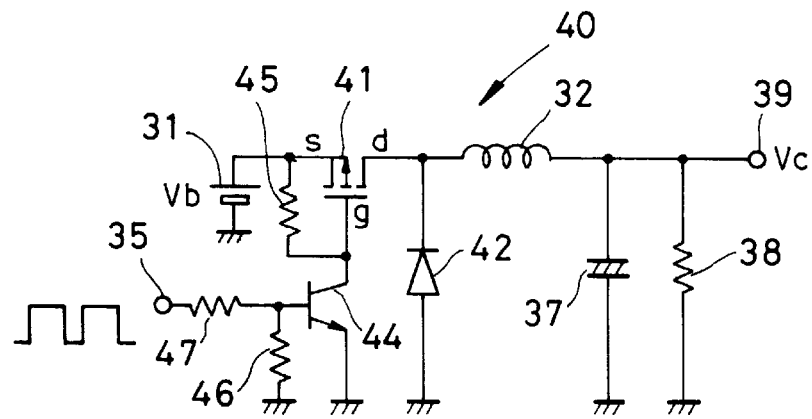
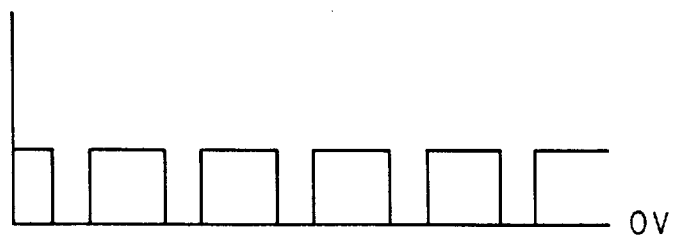
FIG 11A
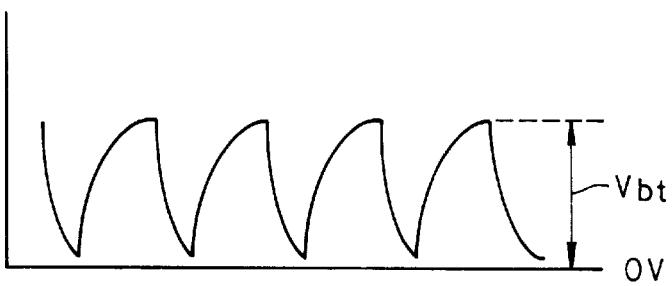
FIG. 11B
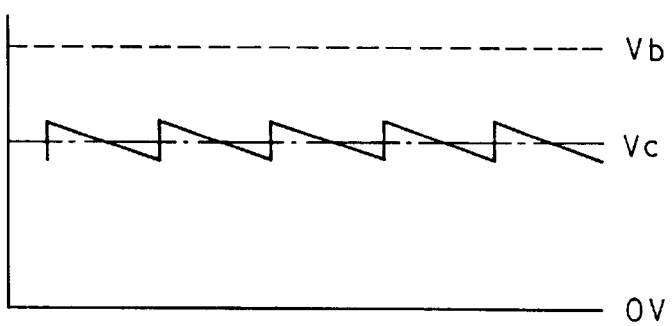
FIG. 11C FIG. 12
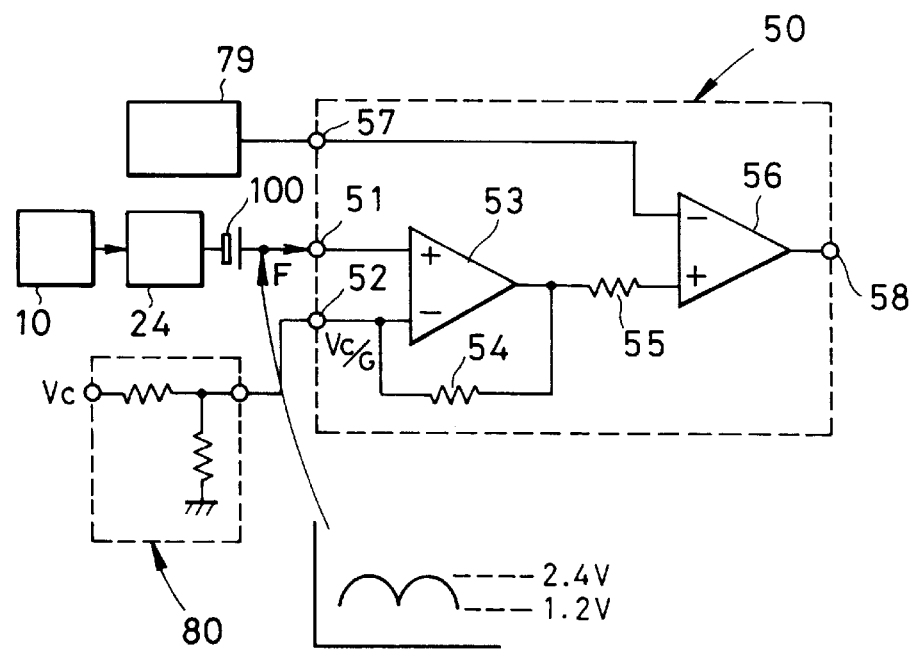
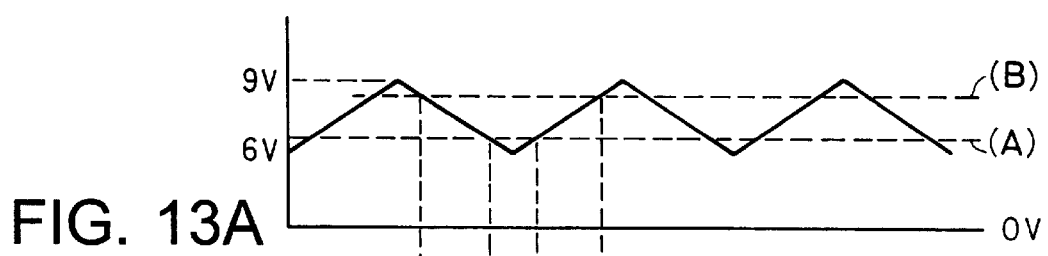
FIG. 13A
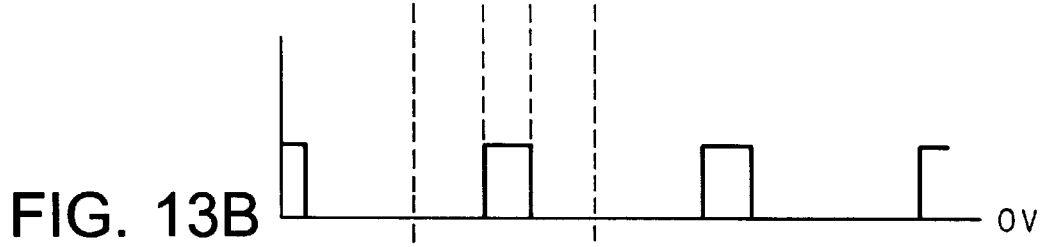
FIG. 13B
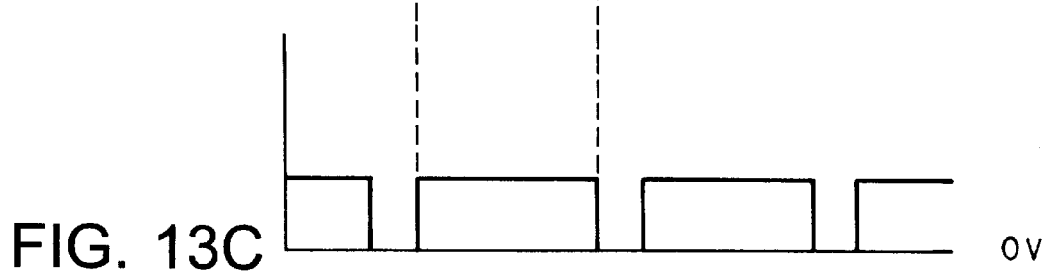
FIG. 13C FIG. 26
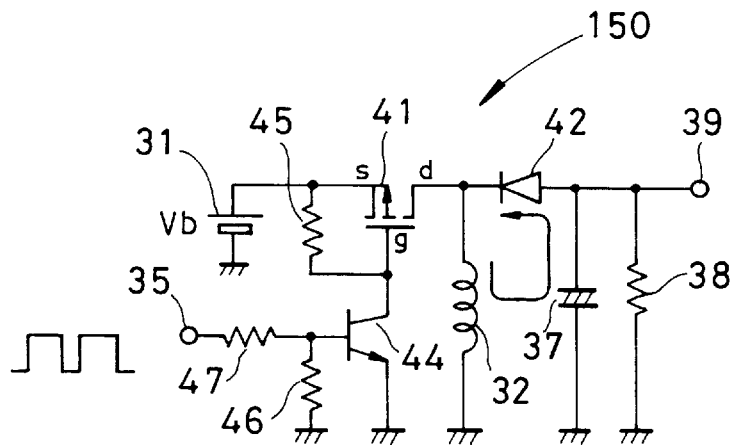
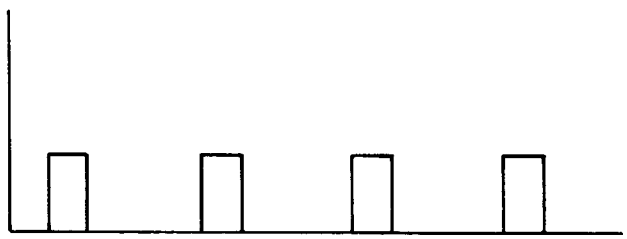
FIG. 27A
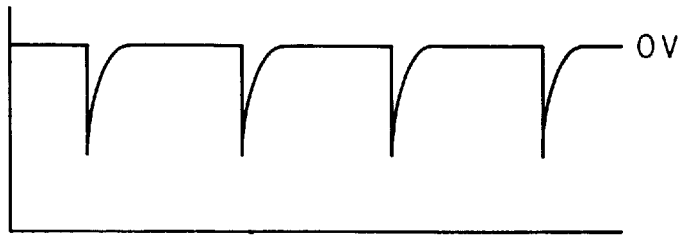
FIG. 27B
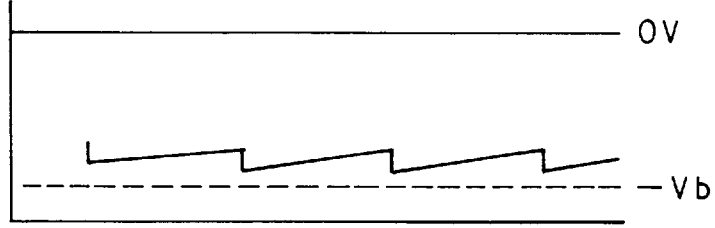
FIG. 27C 5,825,248

LOW POWER CONSUMING BALANCED TRANSFORMER LESS AMPLIFIER DEVICE

BACKGROUND OF THE INVENTION

1. Field of the Invention

The present invention relates to a BTL amplifier device, and more particularly to a BTL amplifier device constructed so that a power supply voltage follows an input signal level.

2. Description of Background Information

Conventionally, a BTL (Balanced Transformer Less) amplifier device has generally been employed as an output circuit for a transistor power amplifier. This BTL amplifier device can obtain an output four times larger than an output from an amplifier based on the ordinary SEPP (Single Ended Push-Pull) system so long as a power voltage to be used is identical, so that special attention has been given to the BTL amplifier device as a power amplifier for a car stereo incorporating therein a battery with an output voltage of 12 V or for a portable stereo using an ordinary battery. However, in recent years, demands for a high output amplifier for the so-called "moving audio room" are so high among the car audio enthusiasts or other people, and a power amplifier or the like for stepping up a power voltage of 12 V, for instance, incorporating therein a DC—DC convertor has been proposed.

FIG. 1 shows a block diagram showing an example of the BTL amplifier device incorporating therein a DC—DC convertor.

In FIG. 1, the reference numeral 31 indicates a battery with an output voltage of 12 V (Vb). The reference numeral 90 indicates a DC—DC convertor which converts the voltage generated by a battery 31 to, for instance, 24 V (Vc is called as a power voltage). The reference numeral 71 indicates an input terminal of a power amplifier section, and a registered 72 for matching is inserted from the input terminal 71 to a ground. An audio signal supplied to the input terminal 71 is connected to between input terminals of an amplifier AA through a capacitor 73 for blocking a direct current. Base terminals of a transistor (a PNP type) Q1 and a transistor (an NPN type) Q2 are connected to output terminals of the amplifier AA respectively. Emitter terminals of the transistors Q1 and Q2 are connected to each other are also connected to one side of the loading resistor RL. A collector terminal of the transistor Q2 is connected to the power voltage, while a collector terminal of the transistor Q1 is connected to the ground.

On the other hand, an audio signal supplied to an input terminal of the amplifier AA is supplied to an input terminal of an amplifier AB as a signal to be inverting by an inverting amplifier 76. Base terminals of a transistor (an NPN type) and a transistor (a PNP type) are connected to output terminals of the amplifier B respectively. Emitter terminals of the transistors Q3 and Q4 are connected to each other and are also connected to the other side of the loading resistor RL. A collector terminal of the transistor Q3 is connected to the power voltage, while a collector terminal of the transistor 4 is connected to the ground.

Brief description is made herein for operations of the BTL amplifier with reference to FIG. 1.

A sinusoidal signal as an audio signal supplied to the input terminal 71 of the BTL amplifier device is supplied to the input terminal of the amplifier AA and is also supplied to the input terminal of the amplifier AB as the signal with the phase having been inverted by the inverting amplifier 76.

At first, if only a half cycle (a shaded portion in the figure) in the positive side of the sinusoidal signal is to be considered, with an output voltage from the amplifier AA, the transistor Q2 is turned ON (connected), while the transistor Q1 is turned OFF ( disconnected). On the other hand, when the signal inverted by the inverting amplifier 76 is supplied to the amplifier AB, the transistor Q3 is turned OFF, and the transistor Q4 is turned ON. Accordingly, a circuit current supplied from the DC—DC convertor 90 flows to the loading resistor RL through the path from the emitter terminal of the transistor Q2 to the loading resistor RL and then from the resistor RL through the emitter terminal of the transistor Q4 to the ground (the direction indicated by the arrow in the figure).

On the other hand, if a half cycle in the negative side is to be considered, with an output voltage from the amplifier AA, the transistor Q2 is turned OFF, and the transistor Q1 is turned ON. While, with an output voltage from the amplifier AB, the transistor Q is turned ON, and the transistor Q4 is turned OFF.

With this configuration, a circuit current supplied from the DC—DC convertor 90 flows to the loading resistor RL through the path from the emitter terminal of the transistor Q3 to the loading resistor RL and then from the resistor RL through the emitter terminal of the transistor Q1 to the ground (the direction indicated by the dotted arrow in the figure).

An output power from the BTL amplifier device can be obtained substantially from the expression of $(Vc)2/2 \times RL$, so that, assuming that the loading resistor is set to 8 Ω, and Vc is, for instance, 12 V (Vc=12 V), an output power of 9 watts can be obtained. Also, assuming that the voltage is stepped up by the DC—DC convertor to, for instance, 24 V (Vc=24 V), an output power will be 36 Watts, thus the amplifier being available as a high output power amplifier.

Herein, assuming that a power voltage applied to the transistors Q3, Q3 is Vc, an output voltage shows a wave form like that between O [V] and Vc [V] in a case shown in FIG. 2a, and in this case, an output voltage wave form is similar to an input voltage wave form. On the other hand, in a case shown in FIG. 2b, an output voltage shows a wave form generating a voltage higher than Vc [V], and in this case, an output voltage is clipped, so that it is not similar to an output voltage wave form and a distortion is generated.

As described above, in a case where it is used as a power amplifier for a car stereo or a portable stereo, the BTL amplifier device can be used as a high output power amplifier if the voltage is stepped up by the DC—DC convertor. However, if a DC—DC convertor is incorporated therein to obtain a high output, the DC—DC convertor is always operating even when a user is listening to a music with a low output, which causes a power loss. Namely, a power loss is generated substantially in portion to the output. In the BTL amplifier device, a bias current optimal to a power voltage loaded thereto is supplied to the power voltage, so that there is an unnecessary power loss generated even when an output is a low level, which is a cause for a short life of a battery especially in a portable stereo.

OBJECT AND SUMMARY OF THE INVENTION

The present invention was made to solve the problems described above, and it is an object of the present invention to provide an efficient and low power consumption BTL amplifier device.

A BTL amplifier device according to a first aspect of the present invention comprises first and second amplifiers constituting a BTL circuit and to which an input signal and a signal obtained by inverting the input signal are supplied respectively; a power voltage supplying circuit for generating an output voltage according to a control signal and supplying the output signal to the first and the second amplifiers as a power voltage; a load connected between output terminals of a first and a second amplifiers; a load voltage detecting circuit for detecting a voltage between the output terminals; a negative feedback circuit for negatively feeding back the output voltage from the load voltage detecting circuit to the input signal side of the BTL circuit; an absolute value circuit for outputting an absolute value of the output voltage from the negative feedback circuit; and a control signal generating circuit for generating a control signal according to a differential voltage between an output voltage from the absolute value circuit and an output voltage from the power voltage supplying circuit.

A BTL amplifier device according to a second aspect of the present invention is characterized in that, in the BTL amplifier device described above, the power voltage supplying circuit comprises a step-up type of chopper circuit, the chopper circuit comprises a DC voltage source; a coil with one end thereof connected to one edge of a DC voltage source; an opening/closing means connected to between the other end of the coil and the other edge of the DC voltage source; a diode connected in series to between output terminals to which an output voltage from the other end of the coil is guided and supplied; and a capacitor for storing a back electromotive force generated in the coil connected to the output terminal as well as to the other edge of the DC voltage source, and the control signal generating circuit generates a control signal with a pulse width according to a difference between an output voltage from the absolute value circuit and an output value from the power voltage supplying circuit, and the opening/closing means outputs a voltage obtained by superimposing a back electromotive force on the voltage stored in the capacitor by opening/closing at times according to a pulse width of a pulse width control signal.

In a BTL amplifier device according to a third aspect of the present invention, the power voltage supplying circuit comprises a step-down type of chopper circuit, the chopper circuit comprises a DC voltage source; an opening/closing means and a coil serially connected to each other between one edge of the DC voltage source and the output terminal to which an output voltage is guided; a diode connected to between a point of connection between the opening/closing means and the coil and the other edge of the DC voltage source; and a capacitor for storing therein a back electromotive force generated in the coil connected to between the output terminal and the other edge of the DC voltage source, and the control signal generating circuit generates a control signal with a pulse width according to a difference between an output voltage from the absolute value circuit and an output value from the power voltage supplying circuit, while the opening/closing means outputs a voltage stored in the capacitor by opening/closing at times according to a pulse width of the pulse width control signal.

In a BTL amplifier device according to a fourth aspect of the present invention, the negative feedback circuit has an operational amplifier, and a voltage of one edge of the load is loaded to a non-inverting input terminal of the operational amplifier, so that a voltage of the load voltage detecting circuit is loaded to an inverting input terminal.

A BTL amplifier device according to a fifth aspect of the present invention comprises first and second amplifiers constituting a BTL circuit and to which an input signal and a signal obtained by inverting the input signal are supplied respectively; a power voltage supplying circuit comprising a first power voltage generating circuit for generating a first power voltage and always supplying the first power voltage to the first and the second amplifiers and a second power voltage generating circuit for generating a second power voltage according to a control signal and supplying a voltage obtained by adding the first power voltage to the second power voltage to the first and the second amplifiers as a power voltage; a load connected to between an output terminal of the first amplifier and that of the second amplifier; a load voltage detecting circuit for detecting voltages at both edges of the load; a negative feedback circuit for negatively feeding back the output voltage from the load voltage detecting circuit to the input signal side of the BTL circuit; an absolute value circuit for outputting an absolute value of the output voltage on the input side of the BTL circuit; and a control signal generating circuit for generating a control signal according to a difference between an output voltage from the absolute value circuit and an output voltage from the power voltage supplying circuit.

A BTL amplifier device according to a sixth aspect of the present invention is characterized in that, in the BTL amplifier device described above, the power voltage supplying circuit comprises a first and a second batteries serially connected to each other; a diode with one edge thereof connected to a common connection point for the first and the second batteries; and a semiconductor switch connected to between the other edge of the second battery opposite to the shared connection point described above and the other edge of the diode, the first battery constitutes the first power voltage generating circuit, the second power voltage generating circuit comprises the second battery and the semiconductor switch, and the semiconductor switch is opened or closed according to an output voltage from the control signal generating circuit controlled according to a difference between an output voltage from the absolute value circuit and an output voltage from the first battery.

In a BTL amplifier device according to a seventh aspect of the present invention, the power voltage supplying circuit comprises a first battery; a DC—DC convertor for receiving a voltage of the first battery as an input voltage; a diode connected to one edge of the first battery; and a semiconductor switch connected to between an output terminal of the DC—DC convertor and the other edge of the diode, the first battery constitutes the first power voltage generating circuit, the second power voltage generating circuit comprises the first battery, the DC—DC convertor, and the semiconductor switch, and the semiconductor switch is opened or closed according to an output voltage from the control signal generating circuit controlled according to a difference between an output voltage from the absolute value circuit and an output voltage from the first battery.

A BTL amplifier device according to an eighth aspect of the present invention is characterized in that, the power voltage supplying circuit comprises first and second batteries serially connected to each other; a diode with one edge thereof connected to a common connection point for the first and the second batteries; and a semiconductor variable resistance element connected to between the other edge of the second battery opposite to the shared connection point described above and the other edge of the diode, the first battery constitutes the first power voltage generating circuit, the second power voltage generating circuit comprises the second battery and the semiconductor variable resistance element, and the resistance value of the semiconductor variable resistance element is controlled according to an output voltage from the control signal generating circuit controlled according to a differential voltage between an output voltage from the absolute value circuit and an output voltage from the first battery.

In a BTL amplifier device according to a ninth aspect of the present invention, the power voltage supplying circuit comprises a first battery; a DC—DC convertor for receiving a voltage of the first battery as an input voltage; a diode connected to one edge of the first battery; and a semiconductor variable resistance element connected to between the output terminal of the DC—DC convertor and the other edge of the diode, the first battery constitutes the first power voltage generating circuit, the second power voltage generating circuit comprises the first battery, the DC—DC convertor, and the semiconductor variable resistance element, and a resistance value of the semiconductor variable resistance element is controlled according to an output voltage from the control signal generating circuit controlled according to a differential voltage between an output voltage from the absolute value circuit and an output voltage from the first battery.

A BTL amplifier device according to a tenth aspect of the present invention comprises a frequency characteristics control circuit connected to between an output terminal from the negative feedback circuit and the absolute value circuit or to between the absolute value circuit and the control signal generating circuit for increasing a high frequency component in an output voltage from the negative feedback circuit.

A BTL amplifier device according to an eleventh aspect of the present invention comprises a wave form shaping circuit for delaying a recovery time in an output voltage from the absolute value circuit to a value larger than an attack time for output.

In a BTL amplifier device according to an twelfth aspect of the present invention, the power voltage supplying circuit comprises a step-up/step-down type of chopper circuit, the chopper circuit comprises a DC voltage source; an opening/closing means and a diode serially connected to each other between one edge of the DC voltage source and an output terminal to which an output voltage is guided; a coil connected to between a point of connecting the opening/closing means to the diode and the other edge of the DC voltage source; and a capacitor for storing a back electromotive force generated in the coil connected to between the output terminal and the other edge of the DC voltage source, the control signal generating circuit generates a control signal with a pulse width according to a difference between an output voltage from the absolute value circuit and an output voltage from the power voltage supplying circuit, and the opening/closing means outputs a voltage stored in the capacitor by opening or closing at times according to a pulse width of the pulse width control signal.

A BTL amplifier device according to a thirteenth aspect of the present invention comprises a plurality of BTL amplifiers comprising a first and a second amplifiers each constituting a BTL and to which an input signal and a signal obtained by inverting the input signal are supplied respectively; a power voltage supplying circuit which is a BTL amplifier device having a load connected to between an output terminal from the first amplifier and that from the second amplifier and for generating an output voltage according to a control signal and supplying the output voltage to the plurality of first and second amplifiers as a power voltage; a plurality of loaded voltage detecting circuits each for detecting voltages at both edges of each of the loads in the plurality of BTL amplifiers; a plurality of negative feedback circuits each for negatively feeding back each of the voltages from the plurality of load-voltage detecting circuits to the corresponding input signal side of the BTL amplifiers respectively; a plurality of absolute value circuits each for outputting an absolute value of each of the output voltages from the plurality of corresponding input signal sides of said BTL amplifiers; a maximum voltage detecting circuit for selecting the maximum voltage among output voltages from the plurality of absolute value circuits and outputting the selected voltage; and a control signal generating circuit for generating a control signal according to a difference between an output voltage from the maximum voltage detecting circuit and an output voltage from the power voltage supplying circuit.

A BTL amplifier device according to a fourteenth aspect of the present invention comprises a plurality of BTL amplifiers comprising a first and a second amplifiers each constituting a BTL circuit and to which an input signal and a signal obtained by reversing the input signal are supplied respectively; a power voltage supplying circuit which is a BTL amplifier device; a load connected to between an output terminal from the first amplifier and that from the second amplifier, and comprising a first power voltage generating circuit for generating a first power voltage and always supplying the first power voltage to the plurality of first and second amplifiers, and a second power voltage generating circuit for generating a second power voltage according to a control signal and supplying a voltage obtained by adding the first power voltage to the second power voltage to the plurality of first and second amplifiers as a power voltage; a plurality of load voltage detecting circuits each for detecting voltages at both edges of each of the loads in the plurality of BTL amplifiers; a plurality of negative feedback circuits each for negatively feeding back each of the voltages from the plurality of load voltage detecting circuits to the corresponding input signal side of the BTL amplifiers respectively; a plurality of absolute value circuits each for outputting an absolute value of each of the output voltages from the plurality of corresponding input signal sides of the BTL amplifiers respectively; a maximum voltage detecting circuit for selecting the maximum voltage among output voltages from the plurality of absolute value circuits and outputting the selected voltage; and a control signal generating circuit for generating a control signal according to a differential voltage between an output voltage from the maximum voltage detecting circuit and an output voltage from the power voltage supplying circuit. In a BTL amplifier device according to a fifth aspect of the present invention, the maximum voltage detecting circuit is an OR circuit for receiving each of output voltages from the plurality of absolute value circuits.

Each of the BTL amplifier devices according to the above aspects of the present invention monitors voltages at both edges of a load connected to between an output terminal from the first amplifier and that from the second amplifier by the load voltage detecting circuit, feeds back this load voltage to the side of an input signal through the negative feedback circuit, compares the input signal to the feedback signal, generates a control signal according to a differential voltage, and supplies this control signal to the power voltage supplying circuit, whereby an optimal power voltage required for an output voltage to be obtained is supplied, so that it is possible to provide a low power consumption and efficient BTL amplifier device.

BRIEF DESCRIPTION OF THE DRAWINGS

FIG. 10 is a block diagram showing the step-up chopper circuit used in the present invention;

FIGS. 11a, 11b and 11c are wave form charts showing operations of the circuit shown in FIG. 10;

FIG. 12 is a block diagram showing the pulse width control circuit used in the present invention;

FIGS. 13a, 13b and 13c are wave form charts showing operations of the circuit shown in FIG. 12;

FIG. 26 is a block diagram showing a step-up/step-down chopper circuit used for the present invention;

FIGS. 27a, 27b and 27c are charts showing operations of the circuit shown in FIG. 26;

DETAILED DESCRIPTION OF THE EMBODIMENTS

Figure 1:
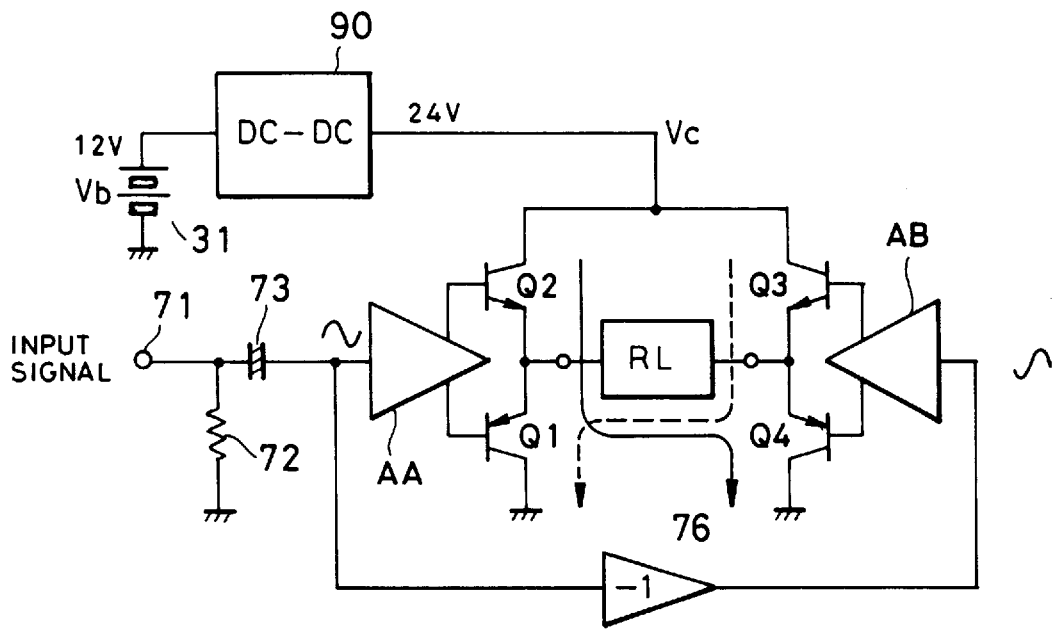
FIG. 1 is a block diagram showing an example of a BTL amplifier device according to prior art.
Figure 2A:
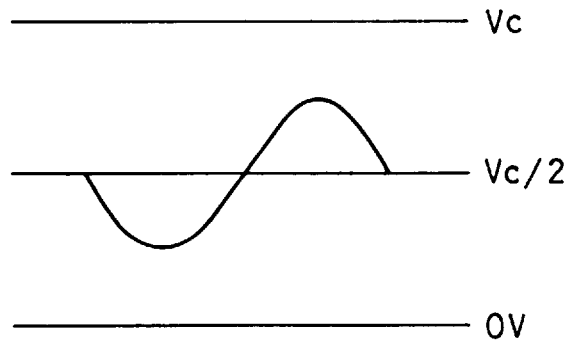
FIGS. 2a and 2b are wave form charts showing operations of the BTL amplifier device shown in FIG. 1.
Figure 2B:
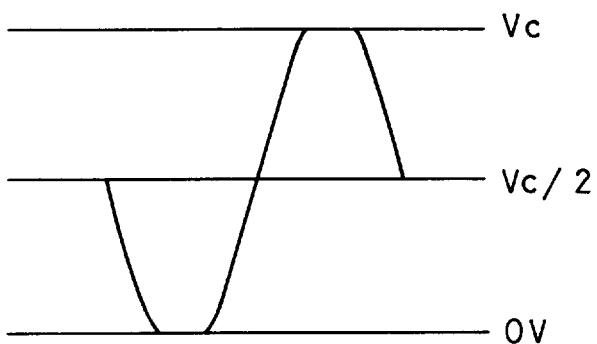
Figure 3:
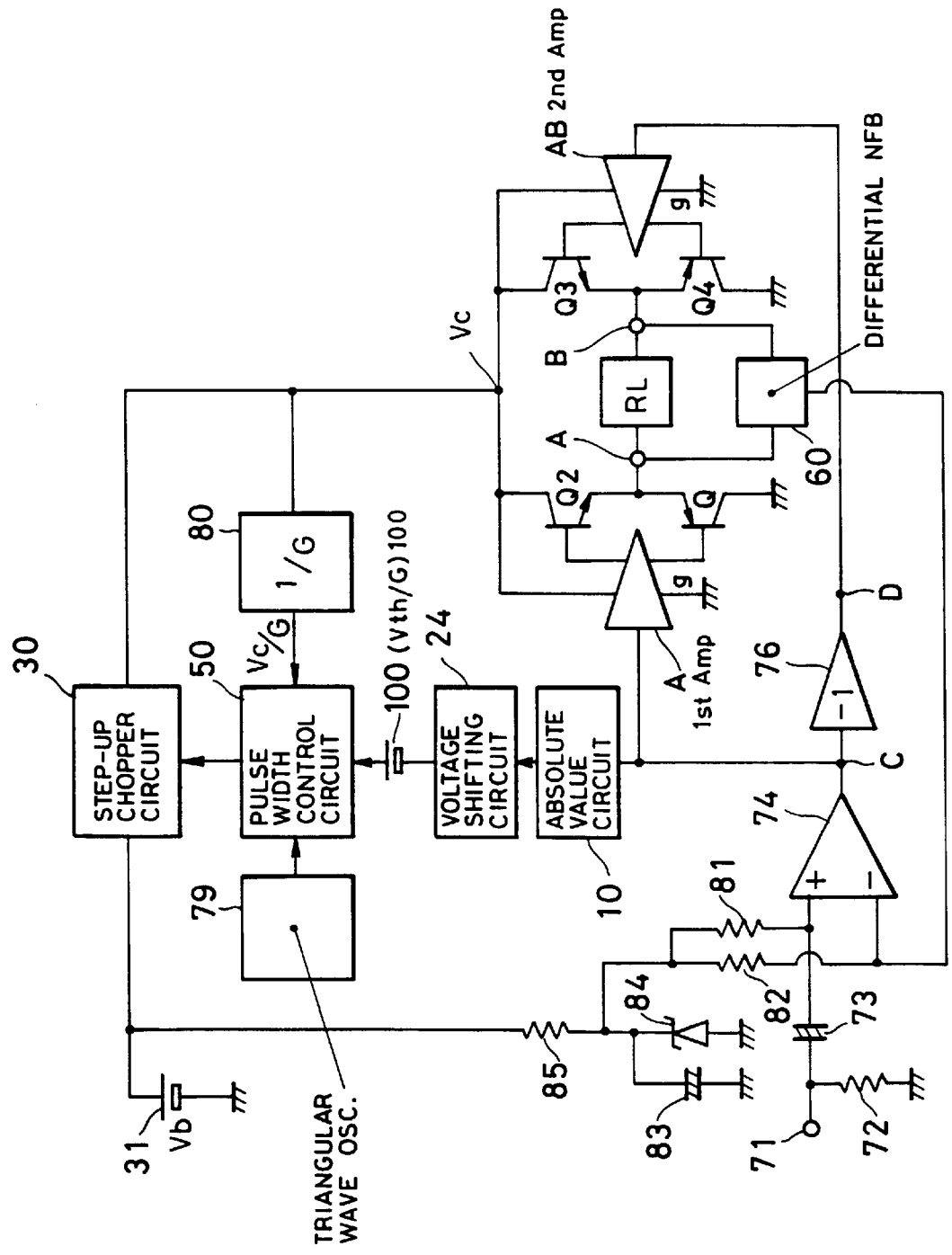
FIG. 3 is a block diagram showing a BTL amplifier device according to Embodiment 1 of the present invention.

FIG. 3 is a block diagram showing the first embodiment of the BTL amplifier according to the present invention.

It should be noted that the same reference numerals are assigned to the parts corresponding to those in the example of the device according to prior art.

In FIG. 3, an audio signal supplied to an input terminal 71 of the BTL amplifier device is supplied to a non-inverting input terminal (+) of an operational amplifier 74 as a negative feedback circuit through a capacitor 73. A power terminal of the operational amplifier 74 is connected to a battery (Vd) 31. The non-inverting input terminal (+) of the operational amplifier 74 is connected to a cathode terminal of a Zener diode 84 through a resistor 81, while an inverting input terminal (−) is connected to a cathode terminal of the Zener diode 84 through a resistor 82 respectively.

A current is supplied to the cathode terminal of the Zener diode 84 from the battery 31 through a resistor 85, so that a substantially half the voltage (called the substantial Vd/2 as a mid-point voltage) of the battery 31 is produced. Also the cathode terminal of the Zener diode 84 is grounded by the capacitor 83 with respect to AC currents.

Supplied to the inverting input terminal (−) of the operational amplifier 74 is an output signal from a differential NFB (negative feedback) circuit 60 as a loaded voltage detecting circuit.

An output signal from the operational amplifier 74 is supplied to an input terminal of an amplifier A as a first amplifier, and is inverted by an inverting amplifier 76, then is supplied to an input terminal of an amplifier B as a second amplifier. Signals supplied to the amplifiers A and B are amplified by the amplifiers respectively and supplied to transistors Q1 to Q4 (gains of the amplifiers A and B are equal to each other and are indicated by G, and it is assumed that the gain factor is equal to 5).

A load resistor RL as a load is connected to between a common emitter terminal of the transistors Q1, Q2 and a common emitter terminal of the transistors Q3, Q4, and output signals at both edges of the load resistor RL are supplied to input terminals respectively through the differential NFB circuit 60. Also the power terminals of the amplifiers A, B and collector terminals of the transistor Q2, Q3 are connected to the power voltage respectively.

On the other hand, an output signal from the operational amplifier 74 is supplied to an absolute value circuit 10, is subjected to conversion of the wave form, and a DC voltage required for the absolute value circuit is superimposed thereon in a voltage shifting circuit 24.

A DC voltage (Vth/G) 100 is added to an output voltage from the voltage shifting circuit 24, which is supplied to one of control input terminals of a pulse width control circuit 50 as a control signal generating circuit. An output voltage from a voltage divider provided for dividing a power voltage into one of the gain of the amplifiers A, B (Vc/G) is supplied to the other comparative input terminal of the pulse width control circuit 50.

A triangular wave oscillator 79 is connected to the pulse width control circuit 50, and a triangular wave signal on which a DC voltage is superimposed is loaded thereto. Then, an output voltage from the pulse width control circuit 50 is supplied to a step-up chopper circuit 30 as a power voltage supplying circuit. The battery 31 is connected to an input terminal of the step-up chopper circuit 30, and an output voltage from the step-up chopper circuit 30 is outputted as a power voltage for the BTL amplifier.

Description is made herein for operations of each of main blocks used for embodiments of the present invention before description is made for operations of the BTL amplifier device.

(1) Absolute Value Circuit and Voltage Shifting Circuit

Figure 4:
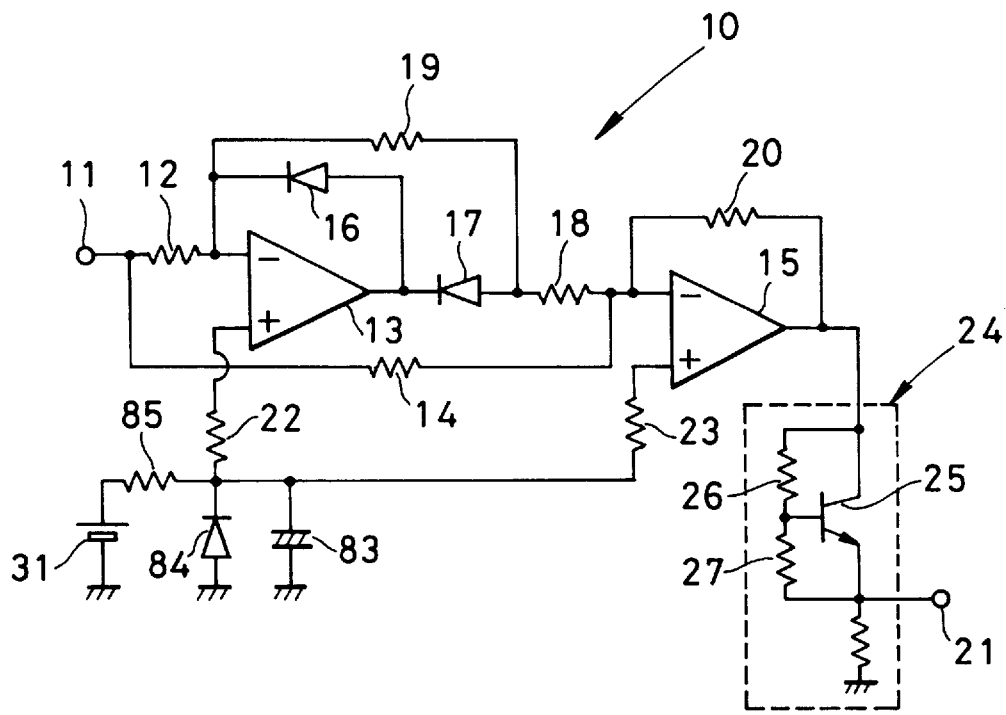
FIG. 4 is a block diagram showing the absolute value circuit and a voltage shifting circuit used in the FIGS. 5a, 5b and 5c are wave form charts showing operations of the circuit shown in FIG. 4.

FIG. 4 is a block diagram showing the absolute value circuit 10. In FIG. 4, the reference numeral 11 indicates an input terminal, and an audio signal is supplied thereto. The audio signal supplied to the input terminal 11 is supplied to an inverting input terminal (−) of the operational amplifier 13 through a resistor 12. A diode 16 is connected to between this inverting input terminal (−) and an output terminal of the amplifier, a cathode terminal of the diode 16 is arranged in the side of inverting input terminal (−). A cathode terminal of a diode 17 is connected to an output terminal of the operational amplifier 13, and an anode terminal of the diode 17 is connected to an inverting input terminal (−) of an operational amplifier 15 through a resistor 18. A resistor 19 is connected to a connection point between the anode terminal and the resistor 18 ( E point), and the other edge of the resistor 17 is connected to the reversing input terminal (−) of the operational amplifier 13.

On the other hand, an audio signal supplied to the input terminal 11 is supplied to the inverting input terminal (−) of the operational amplifier 15 through a resistor 14. An output signal from the operational amplifier 15 is fed back to the inverting input terminal (−) through a resistor 20.

Each of non-inverting inputs terminal (+) of the operational amplifier 13 as well as of the operational amplifier 15 is connected to the cathode terminal of the Zener diode 84 respectively through a resistor 22 and a resistor 23, a voltage by ½ of the voltage in the battery 31, namely a voltage of 6 V (a mid-point voltage).

The voltage shifting circuit 24 is connected to an output of the operational amplifier 15. This voltage shifting circuit 24 comprises a transistor 25 and three lines of resistor, a resistor 26 is connected to between the collector terminal of a transistor 25 and a base terminal, and a resistor 27 is connected to between the base terminal and an emitter terminal respectively, and further the emitter terminal is grounded through a resistor 28. A voltage is shifted by extracting an output signal from the operational amplifier 15 from the emitter terminal through the collector terminal of the voltage shifting circuit 24. Accordingly, an output signal from the voltage shifting circuit 24 is outputted from an output terminal 21 connected to the emitter terminal.

It should be noted that each of the resistors 12, 14, 19 and 20 used in the absolute value circuit 10 has the identical resistance value of, for instance, by R. A resistance value of the resistor 18 is set to R/2.

It is assumed that a ratio between resistance values of the resistor 26 and the resistor 27 each used in the voltage shifting circuit 24 has a relation that resistor 26 : resistor 27=nR : 1.

Each of the power terminals of the operational amplifier 13 and the operational amplifier 15 is connected to a power voltage.

Description is made herein for operations of the absolute value circuit 10.

Figure 5A:
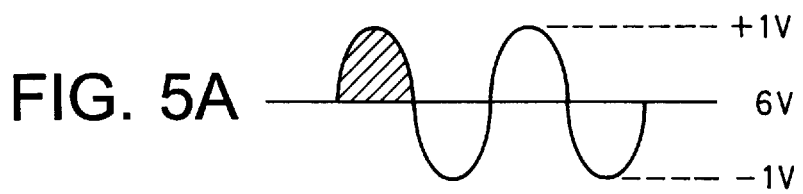
Figure 5B:

It is assumed that an audio signal supplied to the input terminal 11 of the absolute value circuit 10 is a sinusoidal wave with the maximum amplitude of ±1 V to a mid-point voltage. Then, at first, a signal having an amplitude in the positive side of the audio signal (a shaded portion in FIG. 5a) is considered.

When an amplitude in the positive side of 7 V (1 V+a mid-point voltage) is loaded to the input terminal 11, the voltage in the inverting input terminal (−) of the operational amplifier 13 will momentarily rise to 7 V, but the non-inverting input terminal (+) is a mid-point voltage, so that the output voltage from the operational voltage 13 is momentarily pulled to a lower voltage (0V), which makes the diode 16 turn OFF.

At this point of time, the operational amplifier 13 will flow out a current with a value identical to that flown thereinto by the resistor 13 through the resistor 19. The diode 17 tries to guide a current into the output terminal of the operational amplifier 13, so that the anode side of the diode 17 (a point E in the figure) gets lower than the mid-point voltage. When the voltage at the point E has reached 5 V, the current value (a potential difference is 1 V) flowing out through the resistor 19 and the inflow current value (a potential difference is 1 V) through the resistor 12 become identical to each other, so that the operation of the operational amplifier 13 is stabilized. At this point of time, the voltage of the inverting input terminal (−) in the operational amplifier is set to 6 V.

On the other hand, the operational amplifier 15 operates so that the voltage of 7 V supplied to the reversing input terminal (−) in the operational amplifier 15 through the resistor 14 will be 6 V like in the operation of the operational amplifier 13 described above. An inflow current through the resistor 14 ( a potential difference is 1 V) is+1/ R, and an outflow current (a potential difference is 1 V) through the resistor 18 is −1/ R/2=−2/ R, so that a sum of current through the resistor 14 and of that through the resistor 18 becomes −1/ R. Then, the operational amplifier operates so that the shortage of the current will be complemented by the negative feed back circuit through the resistor 20. This shortage of the current can be flown thereinto through the resistor 20 when the output voltage from the operational amplifier is 7 V. Namely, the output voltage when the operation of the operational amplifier 15 is stabilized becomes 7 V, so that an amplitude of 7 V in the positive side equal to the amplitude of the input signal is outputted from the output terminal 21.

Then, discussion is made for an amplitude in the negative side. When 5 V (6 V−1 V) is loaded to the reversing input terminal (−) of the operational amplifier 13, an output voltage from the operational amplifier 13 is momentarily pulled to a higher voltage, which makes the diode 16 turn ON. As a result, a negative feed back circuit from the diode 16 is flown into the inverting input terminal (−), and an inflow current equivalent to an outflow current from the resistor 12 is supplied thereto, so that the operation of the operation amplifier 13 is stabilized. At this point of time, the voltage at the inverting input terminal (−) of the operational amplifier 13 becomes 6 V. A current is not flown into the resistor 19 because a feedback current through the resistor 19 is not required, so that the voltage at the point E becomes 6 V which is the same voltage as that at the inverting input terminal (−).

If a voltage of 5 V is supplied to the inverting input terminal (−) of the operational amplifier 15 through the resistor 14, as described above, the voltage at the inverting input terminal (−) thereof will momentarily go up to 5 V, but the non-inverting input terminal (+) is a mid-point voltage, so that an output voltage from the operational amplifier 15 is momentarily pulled to a higher voltage, and for this reason the feedback current is flown out through the resistor 20.

The voltage at the point E is 6 V, so that an inflow or an outflow of the current will not occur through the resistor 18. Accordingly, when according to the inverted input (−) from the operational amplifier 15, the current equivalent to the outflow current (−1/R) through the resistor 14 is corrected by the negative feed back circuit through the resistor 20, the operation of the operational amplifier 15 is stabilized. At this point of time, the voltage at the inverting input terminal (−) becomes 6 V.

Then, the output voltage from the operational amplifier 15 becomes 7 V, so that an output voltage equivalent to the input signal is outputted, and is also outputted as a voltage with an amplitude in the positive side.

Figure 5C:
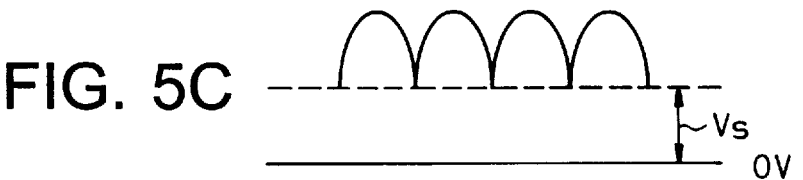

As described above, in the absolute value circuit 10, a portion of the half cycle in the positive side of a sinusoidal wave added to the input terminal 11 appears at the output terminal as it is, while the portion of the half cycle in the negative side thereof is inverted and is outputted in a form of an output having positive polarity, namely as an absolute value signal (called the maximum amplitude of an absolute value signal as Va). This output signal, as shown in FIG. 5c, is one in which an absolute value signal is superimposed on the mid-point voltage.

Next description is made for operations of the voltage shifting circuit 2. This circuit is a circuit for making a voltage (Vce) between the collector and the emitter of the transistor 25 to that (substantially n+1) times larger than a voltage (Vbe−0.6 V) between the base and the emitter thereof assuming that a ratio of the resistor 26 and the resistor 27 is n. For instance, in a case where a collector voltage of the transistor 25 is made to 2.4 V, assuming that a ratio n of the resistor 26 and the resistor 27 is 3 (n=3), the voltage is made to 3×0.6 V which is equal to 1.8 V.

If a resistance value of the resistor 28 is set so that a voltage at the emitter becomes 0.6 V, the collector voltage of the transistor 25 becomes 2.4 V. Namely, when the voltage shifting circuit 24 is connected to the output terminal 21 of the absolute value circuit 10, only a DC voltage among absolute signals superimposed by a DC voltage is suppressed to a shifted voltage (Vs) set by the voltage shifting circuit 24, so that the DC voltage can be shifted. Then this shifted DC voltage can be obtained from the emitter of the transistor 25, and furthermore a DC voltage (Vth / G) is added thereto by the DC voltage 100.

(2) Step-Up Chopper Circuit

Figure 6:
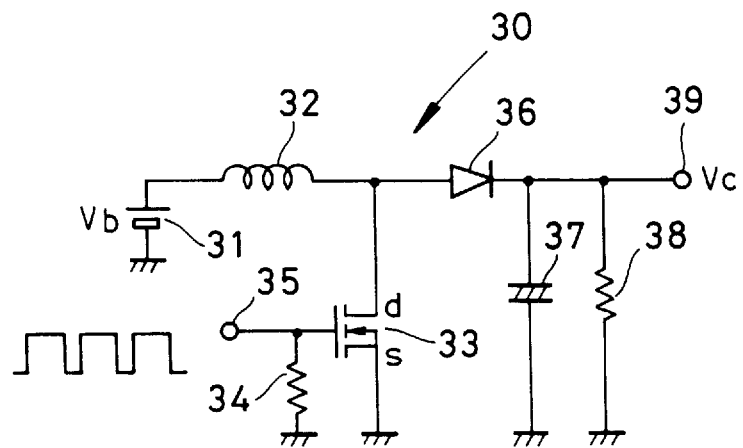
FIG. 6 is a block diagram showing the step-up chopper circuit used in the present invention.

FIG. 6 is a block diagram showing the step-up chopper circuit 30.

As shown in FIG. 6, a coil 32 is connected to the battery 31, and a drain terminal (d) of a NMOS type FET 33 is connected to the other edge of the coil 32. Also a source terminal (s) is grounded. A gate terminal (g) of the FET 33 is grounded through a resistor 34 and is also connected to a pulse input terminal 35.

An anode terminal of a diode 36 is connected to a connection point between the drain terminal and the coil 32. A cathode terminal of this diode 36 is connected to an output terminal 39 and is also grounded through a capacitor 37 and a load resistor 38.

Description will be made for operations of the step-up chopper circuit 30.

Figure 7:
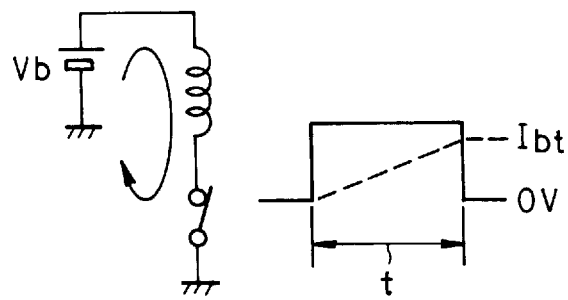
FIG. 7 and FIG. 8 are diagrams showing operations of the circuit shown in FIG. 6.
Figure 8:
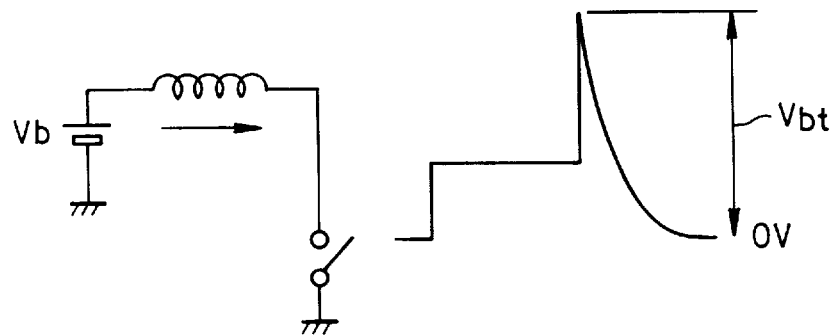

The NMOS type FET 33 effects as an electronic switch for turning ON-OFF by pulse voltages in a range from 0 to a several volts each loaded to the pulse input terminal 35. Description is made for the operations with reference to simulated views with the coil 32 and the switch shown in FIGS. 7 and 8 to make the operations of the step-up chopper circuit 30 clearly understood. As shown in FIG. 7, when the switch is turned ON, a current supplied from the battery 31 is flown into the coil 32 for being stored. A volume of a current Ibt stored in the coil 32 becomes larger in proportion to a period of time (t) of that supplied from the battery 31. FIG. 8 shows a state of an output voltage Vbt when the switch is turned OFF after the period of time (t) has passed.

When one edge of the coil 32 is disconnected by the switch, a current substantially equivalent to the current stored in the coil 32 is discharged from the disconnected edge of the coil 32 according to an effect of back electromotive force. When a voltage generated by the coil 32 according to the current stored in a period of time (t) is Vbt, a voltage generated when the coil 32 is disconnected becomes a value substantially equal to Vb+Vbt. This discharged current is charged in a capacitor 37 and is also consumed in a load resistor 38. As a result, the discharged current is slowly reduced, but the switch is again turned ON by a pulse voltage, so that a current is stored in the coil 32. The operations described above are repeated each time when a pulse voltage is loaded in the switch namely the gate terminal of the FET 33.

Figure 9A:
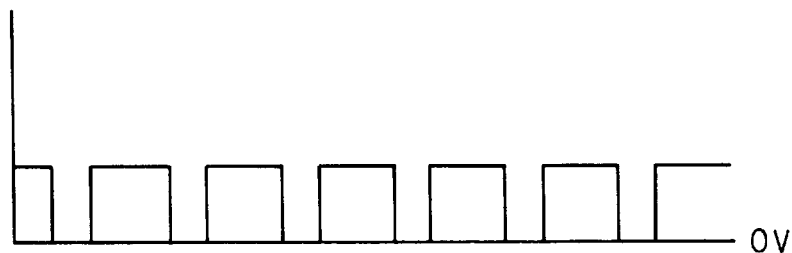
FIGS. 9a, 9b and 9c are wave form charts showing outputs from the step-up chopper circuit.
Figure 9B:
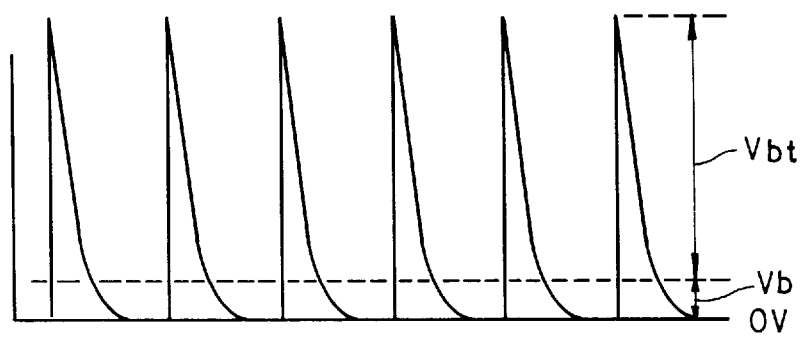
Figure 9C:
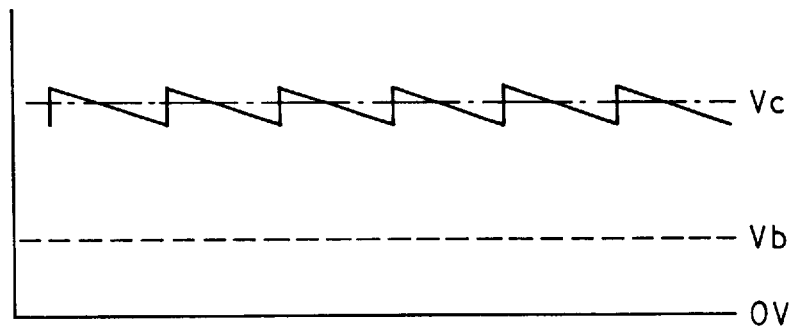

FIG. 9 shows a state when the operations are repeated. FIG. 9a shows a pulse voltage wave form, FIG. 9b shows a discharged current wave form discharged from the opening edge of the coil 32 when the capacitor 37 is not provided in the circuit. FIG. 9c shows a wave form when the discharged current is smoothed by the capacitor 37, which is an output voltage wave form (Vc) of the step-up chopper circuit.

As described above, in the step-up chopper circuit 30, a higher voltage can be outputted if a pulse width a loaded period of time t is made longer) loaded to the gate terminal of the FET 33 is made wider, and if a pulse width is made narrower (a loaded period of time t is made shorter), a voltage can be controlled to a lower voltage of the battery). In this step-up chopper circuit 30, a voltage stepped up to substantially twice or three times as higher as that of the connected battery can be obtained.

(3) Step-Down Chopper Circuit

FIG. 10 is a block diagram showing a step-down chopper circuit 40.

In FIG. 10, a source terminal (s) of a PMOS type FET 41 is connected to the battery 31. A cathode side of a diode 42 and the coil 32 are connected to a drain terminal (d), and an anode side thereof is connected to the ground.

The other edge of the coil 32 is connected to an output terminal 39, and is also grounded through the capacitor 37 and the load resistor 38.

The collector terminal of a transistor 44 is connected to a gate terminal (g) of the FET 41, and the emitter terminal thereof is connected to the ground. A bias resistor 45 is connected to between the gate terminal and the source terminal of the FET 41.

The base terminal of the transistor 44 is grounded through a resistor 46, and is connected to the input terminal 35 through a resistor 47.

Next, description is made for operations of the step-down chopper circuit 40.

The PMOS type FET 41 used in the step-down chopper circuit 40 is a switch for turning ON/OFF a current supplied from the battery 31, and the transistor 44 and resistors 45, 46 constitute a driving circuit for driving the FET 41. Namely, when a pulse voltage of a several volts is loaded to the pulse input terminal 35, the transistor 44 is turned ON.

When the transistor 44 is turned ON, the collector terminal is pulled to substantial 0 V, and a potential of the gate terminal in the FET 41 becomes negative against the source potential, so that the FET 41 is turned ON. When the FET 41 is turned ON, a current in the battery 31 is supplied through the coil 32 and the load resistor 38. Then the current is stored in the coil 32.

Then, when the FET 41 is set in the disconnected state, the battery 31 is released, and the current stored in the coil 32 is discharged through the load resistor 38 and the diode 42. The discharged current generated by a back electromotive force of this coil 32 is discharged to a ground potential assuming that a voltage in a forward direction of the diode 42 does not exist, and the current is subjected to smoothing in the capacitor 37 to be outputted to the output terminal 39.

A relation between a volume of a current stored in the capacitor 32 and a period of supplied time (t) is the same as that described in the step-up chopper circuit 20, so that description thereof is omitted herein.

FIG. 11a shows a pulse voltage loaded to the input terminal 35 of the step-down chopper circuit 40. FIG. 11b shows a wave form of a discharged current of the coil 32 when the capacitor 37 is not provided therein. FIG. 11c shows a wave form of an output voltage when the current is subjected to smoothing in the capacitor 37.

As described above, the step-down chopper circuit 40 can step down an output voltage according to a pulse width of a pulse voltage loaded to the base terminal of the transistor 44.

Namely, if a pulse width is made wider, a voltage can be closer to the voltage in the battery 31, while if the pulse width is made narrower, it can be stepped down to almost 0 V.

(4) Pulse Width Control Circuit

FIG. 12 is a block diagram showing the pulse width control circuit 50 and the driving circuit thereof.

In FIG. 12, the reference numeral 51 indicates a control input terminal, which is connected to the non-reversing input terminal (+) of an operational amplifier 53. An output signal from the voltage shifting circuit 24 is inputted into this control input terminal 51. The reference numeral 52 indicates a comparative input terminal 52, and is connected to the inverting input terminal (−) of the operational amplifier 53. An output voltage from the voltage divider 80 is loaded to the comparative input terminal 52. A resistor 54 between the inverting input terminal (−) and the output terminal in the operational amplifier 53 is provided for suppressing a gain of the operational amplifier 53 to a low level. An output signal from the operational amplifier 53 is supplied to the non-inverting input terminal (+) of an operational amplifier 56 through a resistor 55. An output signal from the operational amplifier 56 is outputted from an output terminal 58.

An input terminal 57 for a triangular wave is connected to the inverting input terminal (−) of the operational amplifier 56, and a signal on which a DC voltage is superimposed on an output signal is supplied thereto from the triangular-wave oscillator 79 connected to the triangular-wave input terminal 57. Each of power terminals of operational amplifiers 53 and 56 is connected to the Vb. Description is made herein for operations of the pulse width control circuit 60.

At first, a voltage loaded to the comparative input terminal 52 is a voltage obtained by dividing a voltage at the power terminal of the BTL amplifier into 1/G by the voltage divider 80.

Namely, assuming that the power voltage Vc is 12 V and G is 5, the comparative voltage of 12/5 is set to 2.4 V.

On the other hand, a voltage loaded to the control input terminal 51 boots operations of the step-up chopper circuit 30, and also is used as a control voltage provided for deciding an operating voltage required when the power voltage is stepped up, so that this control voltage becomes a voltage with the maximum amplitude of an absolute value signal superimposed by a DC voltage. Namely, the voltage with the maximum amplitude of 2.4 V is required as a control voltage, so that as a voltage loaded to the control input terminal 51, it is assumed that a voltage at the DC voltage source is 1.2 V and that of the maximum amplitude of the absolute value signal is 1.2 V (a wave form shown at the point F in the figure).

At first in a case where a voltage with the maximum amplitude slightly lower than 2.4 V is supplied as a control voltage to the non-inverting input terminal (+) of the operational amplifier 53 and a reference voltage of 2.4 V is supplied to the inverting input terminal (−) thereof, an output voltage from the operational amplifier 53 is substantially 0 V. And for this reason, this output voltage is supplied to the non-inverting input terminal (+) of the operational amplifier 56.

As for a voltage of a triangular wave loaded to the reversing input terminal (−) of the operational amplifier 56, the non-inverting input terminal (+) of the operational amplifier 56 is substantially 0 V, so that an output voltage becomes substantially 0 V assuming that a voltage of a triangular wave is superimposed by a DC voltage changing, for instance, in a range from +6 V to +9 V as shown in FIG. 6b.

Then, when a voltage loaded to the control input terminal 51 becomes slightly larger than +2.4 V, an output voltage from the operation amplifier 53 indicated at (A) in FIG. 6b is outputted, a voltage at the non-inverting input terminal (+) of the operational amplifier 56 is compared to a voltage of a chopping wave at the inverting input terminal (−) thereof, a higher voltage (Vb) is outputted during a period of time when the voltage at the non-inverting input terminal (+) is higher than the other, while a lower voltage (0 V) is provided as output during a period of time when the voltage at the reversing input terminal (−) is higher than the other. FIG. 6c shows a state of an output wave form from the operational amplifier 56 at this point of time described above.

When the voltage loaded to the control input terminal 51 becomes higher, and the output voltage indicated by (B) shown in FIG. 13a is outputted as an output voltage from the operational amplifier 53, as shown in FIG. 13c, the pulse width of the output voltage from the operational amplifier 56 is wider than that in a case shown in FIG. 13b, which is outputted. Namely, the pulse width control circuit 50 is a circuit for changing a pulse width according to a difference between a voltage loaded to the control input terminal 51 and that loaded to the comparative input terminal 52 and outputting the changed pulse width. (5) Differential NFB circuit (5) Differential NFB Circuit FIG. 14 is a block diagram showing the differential NFB circuit 60 with the peripheral circuit included therein.

Figure 14:
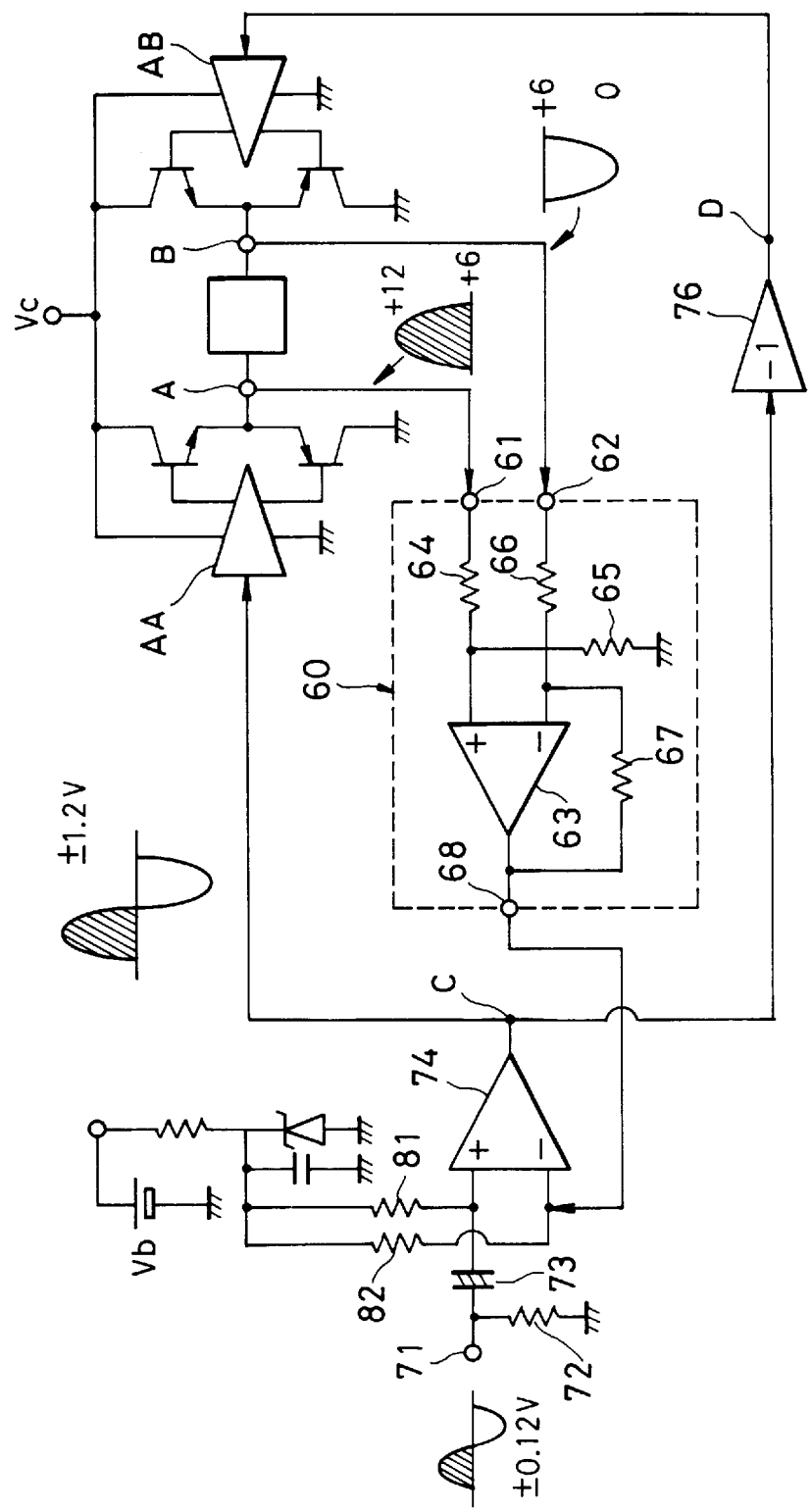
FIG. 14 is a block diagram showing a differential NFB circuit used in the present invention.

In FIG. 14, the reference numeral 61 indicates one of input terminals of the differential NFB circuit 60, and a signal at the point A of the load resistor RL is supplied thereto. The reference numeral 62 indicates the other terminal thereof, and a signal at the point B of the load resistor RL is supplied thereto.

The signal supplied to the input terminal 61 is supplied to the non-inverting input terminal (+) of an operational amplifier 63 through a resistor 64. A resistor 65 is connected to a section between the non-inverting input terminal (+) thereof and the ground. A signal supplied to the input terminal 62 is supplied to the inverting input terminal (−) thereof through a resistor 66. A resistor 67 is connected to a section between this reversing input terminal (−) and the output terminal. Then, an output signal from the operational amplifier 63 is outputted from an output terminal 68.

Description will be made herein for operations of the differential NFB circuit 62.

At first, it is assumed that an audio signal of, for instance, +0.12 V is supplied to an input terminal 71 of the BTL amplifier device, this audio signal is amplified in an operational amplifier 74, and a voltage with the maximum amplitude of +12 V is outputted (point C). An output signal from this operational amplifier 74 is supplied to the amplifier A, and is also supplied to the amplifier B after the signal is inverted by the inverting amplifier 76. In a case where the amplifiers A and B has not any input signals (no signal), assuming that Vb is equal to Vc which is 12 V, a voltage at each of both edges of the load resistor RL becomes a half voltage of the Vc (a mid-point voltage) respectively, namely 6 V.

If only a portion of the positive side (shaded portion in the figure) of a sinusoidal wave ±1.2 V at the point C is to be considered, the voltage at the point A is displaced to +12 V as a voltage added 6 V to the mid-point voltage, namely as a voltage to which a voltage corresponding to an amplitude of the output voltage is added according to the output signal (1.2 V×G=6 V) amplified by the amplifier A.

On the other hand, when the signal inverted by the inverting amplifier 6 is supplied to the amplifier B, the voltage at the point B is displaced to 0 V as a voltage in which 6 V is subtracted from the mid-point voltage, namely a voltage from which a voltage corresponding to an amplitude of the output voltage is subtracted according to an output voltage from the amplifier B. As a result, each of both edges of the load resistor RL is displaced to 12 V to an input voltage of the positive side of the sinusoidal wave.

Similarly, if only the portion of the negative side of the sinusoidal of −1.2 V is to be considered, the voltage at the point A is displaced to a voltage in which 6 V is subtracted from the mid-point voltage, namely to 0 V, and the voltage at the point B is displaced to a voltage in which 6 V is added to the mid-point voltage, namely to 12 V. As a result, as an output between the point A and the point B, a signal supplied to each of the input terminals of the amplifiers A and B is made to 10 (2×G) times larger than the supplied signal and is outputted.

Each voltage at the point A and the point B is supplied to each of the input terminals 61 and 62 of the differential NFB circuit 60 respectively. This supplied signal is supplied to the non-inverting input terminal (+) of the operational amplifier 63 after the signal is divided in the resistor 64 and the resistor 65. Similarly, the signal supplied to the input terminal 62 is supplied to the inverting input terminal (−) thereof after the signal is divided in the resistor 66 and the resistor 67, is added to the signal supplied to the non-reversing input terminal (+) and then outputted. The resultant voltage divided by the resistors 64, 65 and that divided by the resistors 66, 67 are set to the same level, and are also set to be equal to a reciprocal of the total gain (Gt) required in the BTL amplifier device. Namely, each of the resistance values is set to a relation of resistor 65 / resistor 64 which is equal to resistor 67 / resistor 66 as well as to 1/ Gt. The value of 1/Gt shown herein is a feedback factor for the entire BTL amplifier device.

An output voltage from the operational amplifier 63 is set to and outputted as a value 1/Gt times larger than the input voltage, so that an amplitude of a signal fed back to the inverting input terminal (−) of the operational amplifier 74 becomes identical to that of an audio signal inputted to the non-inverting input terminal (+).

As described above, an audio signal of ±0.12 V is supplied to the non-inverting input terminal (+) of the operational amplifier 74, while an output signal from the differential NFB circuit 60 with the maximum amplitude of ±0.12 V is supplied to the inverting input terminal (−) thereof. Namely, an amplitude of a signal supplied to the two input terminals of the operational amplifier 74 can always be maintained in a relation of 1 to 1 while the maximum amplitude of output each from the amplifiers A and B is lower as compared to the power voltage of the BTL amplifier.

However, when an audio signal of more than ±0.12 V is inputted to the input terminal 71 of the BTL amplifier device, the portion of the positive side of a sinusoidal wave is restricted by a power voltage, and the portion of the negative side thereof is restricted by the ground potential (0 V).

As a result, an output wave form from each of the amplifiers A and B is symmetrically clipped in both positive and negative sides of a sinusoidal wave. This clipped signal is inputted to the differential NFB circuit 60, and is supplied to the inverting input terminal (−) of the operational amplifier 74 as an output voltage from the operational amplifier 63.

Next description is made for a case where a power voltage of the BTL amplifier is changed from +12 V to, for instance, +24 V to make the output power further larger.

A mid-point potential between the amplifiers A and B is fixed with an output voltage from the operational amplifier 74 with no signal therein, so that, even if the power voltage Vc is changed to +24 V, a mid-point voltage between the point A and the point B when there is no signal therein is both +6 V. And, in a case where an audio signal supplied to the input terminal 71 is increased and an output amplitude from each of the amplifiers A and B becomes, for instance, ±8 V, the voltage at the point A is a voltage obtained by adding 8 V to the mid-point voltage, namely the voltage is displaced to 14 V as a voltage adding thereto that corresponding to the amplitude of the output voltage to the half cycle of the positive pole in a sinusoidal wave.

As for an output voltage appearing in the amplifier A, an output voltage therefrom is not restricted according to the power voltage for the point A because the power voltage is set to +24 V there. On the other hand, the voltage at the point B is displacing to −2 V as a voltage obtained by subtracting 8 V from the mid-point voltage, but the voltage at the point B is restricted at 0 V (the portion p in FIG. 15b).

Figure 15A:
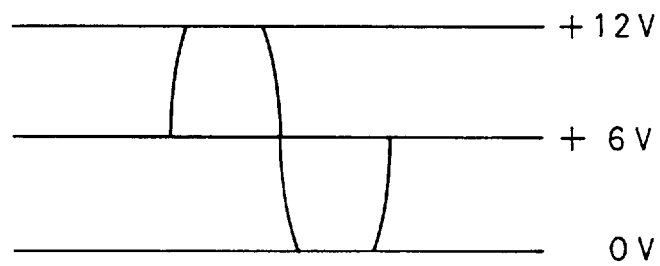
FIGS. 15a, 15b and 15c are output voltage wave form chart showing a state when a power voltage of the BTL amplifier device is changed.
Figure 15B:
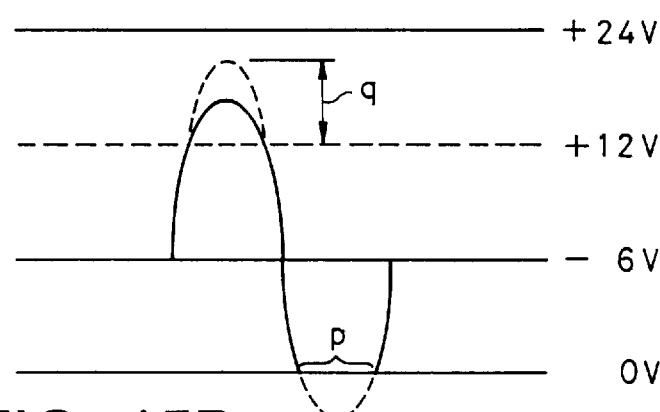
Figure 15C:
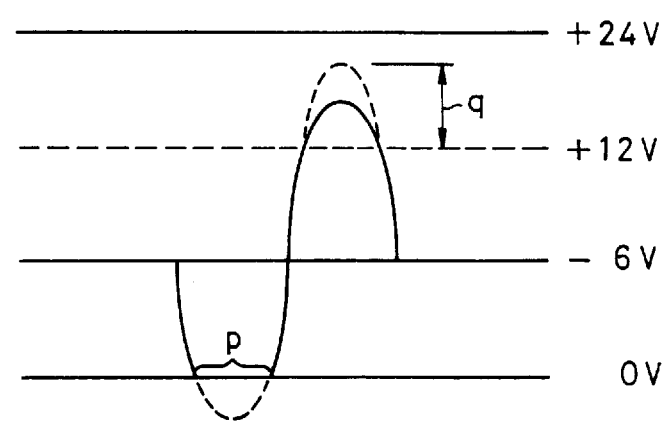

On the other hand, an output voltage from the amplifier B has an opposite phase to that from the amplifier A, so that the voltage is a wave form as shown in FIG. 15c.

Herein, each voltage at both edges of the load resistance RL is fed back to the inverting input terminal (−) of the operational amplifier 74 through the differential NFB circuit 60, and is compared to the signal at the non-inverting input terminal (+) to which an input signal is added. The operational amplifier 74 outputs a signal corresponding to a difference between the two input signals, the outputted signal is received by the amplifiers A and B, and the amplifiers A, B and the transistors Q1 to Q4 are driven according to the input signal. Namely, voltages at both of the edges of the load resistance RL detected by the differential NFB circuit 60 are negatively fed back to the side of input signal by the negative feed back circuit driven by the operational amplifier 74 so that voltage wave forms at both edges of the load resistance RL become similar to input signal wave forms, and for this reason the output voltage from the amplifier B corresponding to the portion (the portion p in FIG. 15b) in which the output voltage from the amplifier A is restricted extends like the potion q in FIG. 15c.

Also, the output voltage from the amplifier A corresponding to the portion (the portion p in 15c) in which the output voltage from the amplifier B is restricted extends like the potion q in FIG. 15c.

As described above, the amplifiers A and B effect to each other so that each of the portions in which the output voltage is restricted is complemented by each the amplifiers, and an output signal obtained by synthesizing the wave form shown in FIG. 15b and that shown in FIG. 15c becomes a similar wave form to an input signal without being clipped.

Next description is made for operations of the BTL amplifier device with reference to FIG. 3.

In the embodiment of the present invention, in a case where the maximum amplitude voltage of an audio signal supplied to the input terminal of the BTL amplifier device exceeds ±0.12 V, the pulse width control circuit 50 outputs a control signal to the step-up chopper circuit 30 for changing the power voltage. Namely the following description is made assuming that the power voltage Vc before the step-up chopper circuit 30 operates is 12 V (Vc=12 V).

It is assumed that an audio signal with the maximum amplitude of ±0.12 V is supplied to the input terminal 71 of the BTL amplifier device and, for instance, a signal of (1.2 V−Vth / G) V is outputted to the output terminal (point C) of the operational amplifier 74.

An output signal from the operational amplifier 74 is supplied to the amplifier A, and is inverted by the inverting amplifier 76, then the inverted signal is supplied to the amplifier B. This signal is amplified in each of the amplifier A and the amplifier B and outputted as a signal of ±6 V.

An output signal from the operational amplifier 74 is supplied to the absolute value circuit 10, and is changed to an absolute value signal therein. Then the output signal from the absolute circuit 10 is supplied to the voltage shifting circuit 24. As a DC voltage of 6 V (mid-point potential) is superimposed on the absolute value signal, the voltage is shifted to 4.8 V (for a corrected voltage) in the voltage shifting circuit 24, and further a DC voltage source 100 is added thereto as a voltage corresponding to that to be supplied of the power voltage for being supplied to the control input terminal 51 of the pulse width control circuit 50. On the other hand, as a voltage in which the voltage of the power voltage is decreased by the voltage divider 80, 2.4 V is supplied to the comparative input terminal 52 of the pulse width control circuit 50.

The voltages supplied to the control input terminal 51 as well as to the comparative input terminal 52 of the pulse width control circuit 50 are corrected so that both of the voltages will be identical in potential for the maximum amplitude voltage, so that an output voltage from the pulse width control circuit 50 is substantially 0 V. For this reason, an output voltage from the step-up chopper circuit 30 substantially identical to a voltage of the battery 31 is supplied as a power voltage.

Next description is made for a case where an audio signal of more than ±0.12 V is supplied to the input terminal 71 of the BTL amplifier device.

It is assumed that the signal supplied to the input terminal 71 is amplified in the operational amplifier 74, is further amplified in the amplifier A and the amplifier B, and a signal of ±8 V is outputted from each of the output terminals of the amplifiers A and B. A gain G in each of the amplifiers A and B is set to 5 (G=5), so that the output terminal of the operational amplifier 74, namely the voltage at the point C in FIG. 3 is ±1.6 V.

The voltage at the point C is outputted as a signal in which the absolute value signal with the maximum amplitude of 1.6 V is superimposed on the mid-point voltage in the absolute value circuit 10. This signal is corrected with a correcting voltage of 4.8 V in the voltage shifting circuit 24, and a DC voltage 100 (Vth/G) is further added thereto, and the voltage with the maximum amplitude of (2.8+Vth/G) V is supplied to the control input terminal 51 of the pulse width control circuit 50. Namely, a voltage, obtained by shifting an absolute value of the voltage for an output signal from the operational amplifier 74 to 4.8 V level and further adding a DC voltage (Vth/G) thereto, is loaded to the control input terminal 51. At this point of time, the voltage loaded to the comparative input terminal 52 is 2.4 V, so that the pulse width control circuit 50 outputs a voltage having a pulse according to the voltage loaded to each of the amplifiers A and B.

The step-up chopper circuit 30 turns the FET 33 ON or OFF according to the pulse voltage supplied from the pulse width control circuit 50, and steps up the battery 31 for output.

Figure 17A:
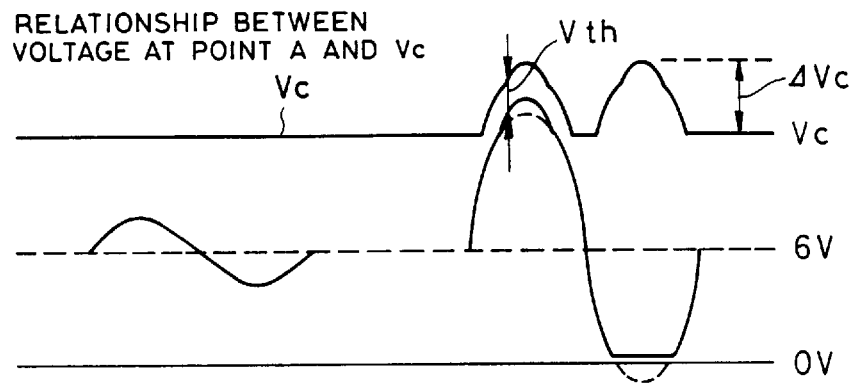
FIGS. 17a, 17b and 17c are charts showing a relation between fluctuation of a power voltage and an output voltage in the BTL amplifier device according to Embodiment 1 of the present invention.
Figure 17B:
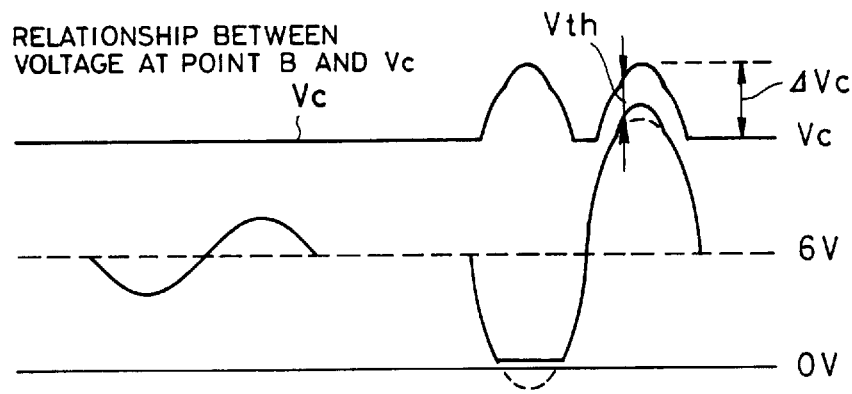

As a result, power voltages supplied to the amplifiers A, B as well as to the transistors Q1 to Q4, as shown in FIGS. 17a and 17b become voltages ΔVc in which the output voltages at the point A and the point B each of which is one edge of the load resistance RL are stepped up by the DC voltage Vth.

Figure 16A:
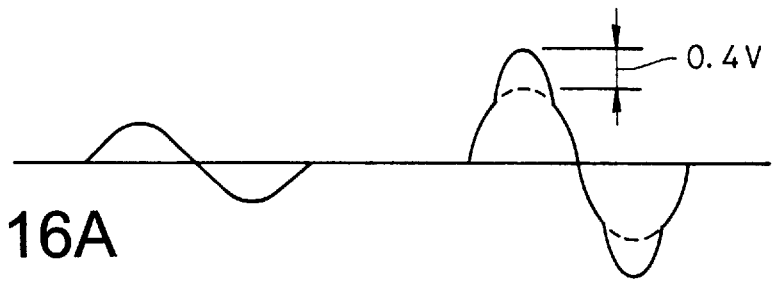
FIGS. 16a and 16b are wave form charts showing a wave form of a signal fed back to an input side when an output signal is clipped.

On the other hand, as described above, the negative feed back circuit has such configuration that the operational amplifier 74 outputs a signal according to the difference between the voltages at both edges of the load resistor RL in which the input signal is added to the non-reversing input terminal (+) and that is added to the reversing input terminal (−) and the signal is inputted to each of the amplifiers A and B, so that the voltage wave forms at both edges of the load resistor become similar to input signal wave forms. Accordingly, a output voltage from the operational amplifier 74, as shown in FIG. 16a, has a wave form in which an output voltage from the amplifier B (A) corresponding to the portion in which the output voltage from the amplifier A (B) is restricted is extended.

Figure 16B:
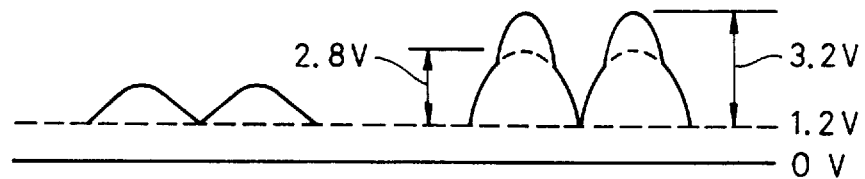

For this reason, an absolute value of the output voltage from the operational amplifier 74 described above is obtained in the absolute value circuit 10, and by shifting the level of the obtained absolute value in the voltage shifting circuit 24, the wave form shown in FIG. 16b is obtained. A DC voltage (Vth/G) is added to this absolute value voltage as a portion to be supplied of the power voltage and the added voltage is supplied to the control input terminal 51 of the pulse width control circuit 50, so that, as shown in FIG. 17a, in a feed back corresponding to the portion in which the output voltage from the amplifier B is restricted, the voltage obtained by stepping up the power voltage Vc by the portion Vth thereof is supplied to the output voltage from the amplifier A, so that an output voltage from this amplifier A becomes a wave form in which the supplied voltage is extended. Also, as shown in FIG. 17b, in a feed back corresponding to the portion in which the output voltage from the amplifier A is restricted, the voltage obtained by stepping up the power voltage Vc by the portion Vth thereof is supplied to the output voltage from the amplifier B, so that an output voltage from this amplifier B becomes a wave form in which the supplied voltage is extended.

Figure 17C:
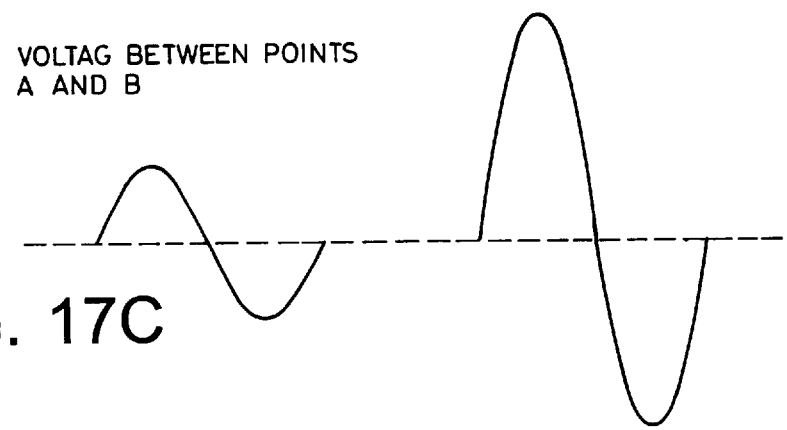

For this reason, by synthesizing the voltages of both of the amplifiers, the terminal voltage of the load resistor RL becomes a voltage twice as larger as the output voltage from the amplifier A or B, as shown in FIG. 17c, and having a wave form similar to that of the input signal thereto.

The pulse voltage supplied to the step-up chopper circuit 30 is a signal made from the triangular signal 10 times to 20 times as larger as the audio signal, so that an operational speed at which the step-up chopper circuit 30 is controlled is several times as quicker as the audio frequency. Accordingly, the power voltage can be changed according to changes of the audio signal.

Figure 18:
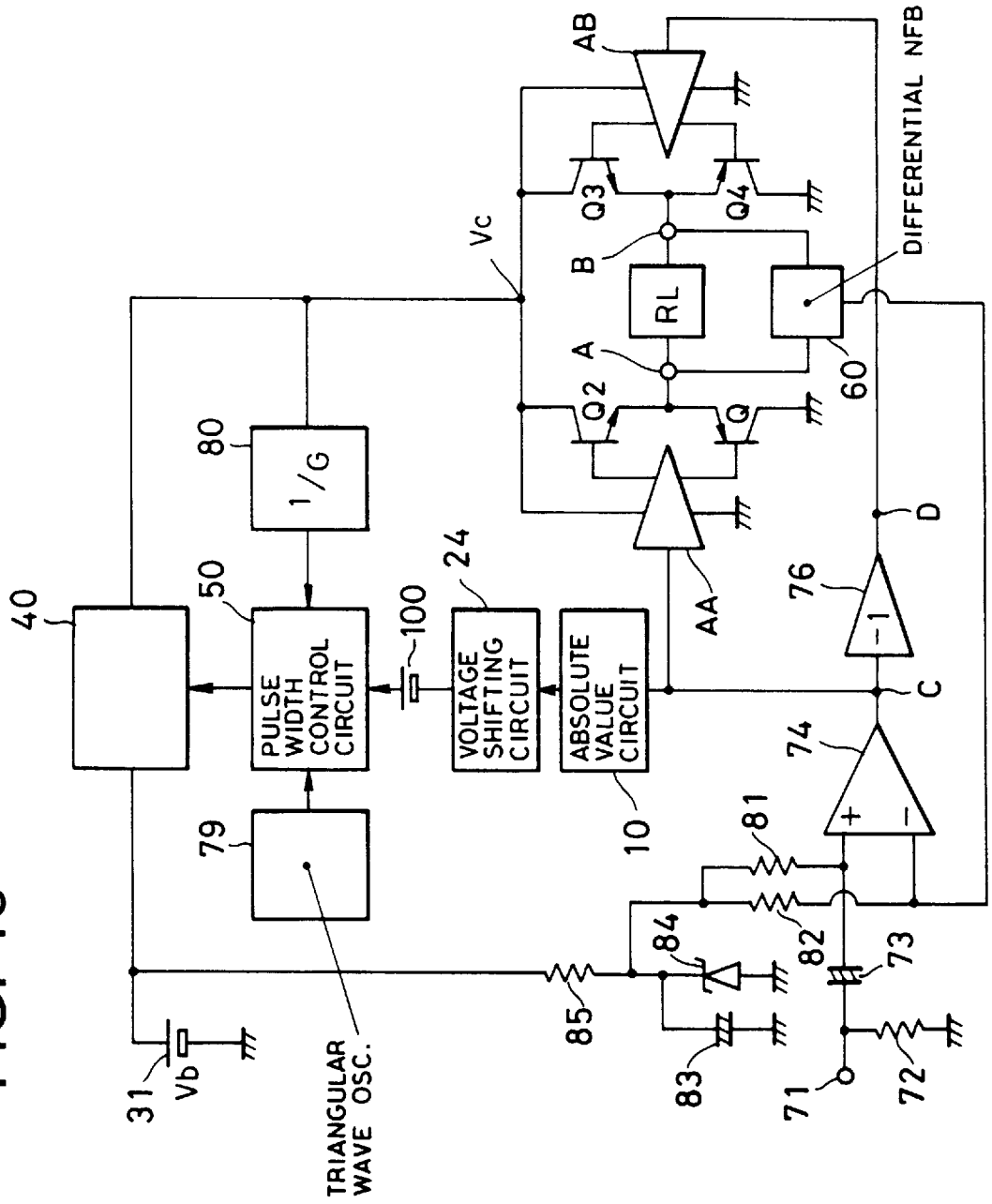
FIG. 18 is a block diagram showing a BTL amplifier device according to Embodiment 2 of the present invention.

FIG. 18 is a block diagram showing a BTL amplifier device according to Embodiment 2 of the present invention, and a case where the step-down chopper circuit 40 is used for the BTL amplifier device is shown therein as an example.

The different point of this embodiment from Embodiment 1 shown in FIG. 3 is use of the step-down chopper circuit 40 in place of the step-up chopper circuit 30 herein. Operations of the step-down chopper circuit 40 was described above, so that description thereof is omitted herein.

Figure 19:
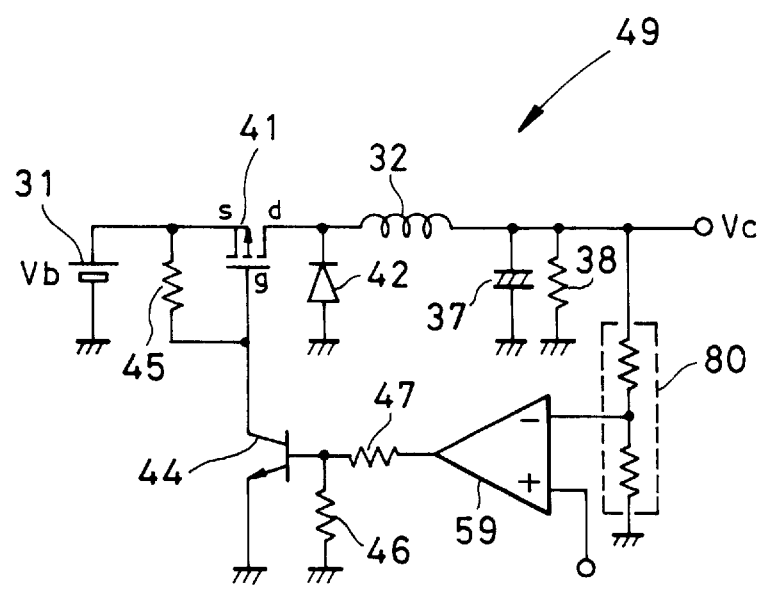
FIG. 19 is a block diagram showing a self-exciting type of step-down chopper circuit used in the present invention.

FIG. 19 is a block diagram showing a step-down chopper circuit 49 based on a self-exciting system in a case where the step-down chopper circuit 40 has configuration based on the self-exciting system. This step-down chopper circuit 49 based on the self-exciting system is different from the step-down chopper circuit 40 shown in FIG. 10 in that the step-down chopper circuit based on the self-exciting system employs a self-exciting oscillation frequency decided according to the coil 32, capacitor 37, and the load resistor to the step-down chopper circuit 40 in FIG. 10 which steps up a voltage of the battery 31 according to a pulse width from the pulse width control circuit 50 shown in FIG. 12.

Namely, the FET 41 is switched ON according to the self-exciting oscillation frequency, the capacitor 37 is charged thereby, and the charged voltage is outputted. The voltage obtained by dividing this output voltage with the voltage divider 80 is compared to that supplied from the absolute value circuit in an operational amplifier 59, and an output voltage is supplied to the transistor 44 for driving the FET 41. The step-down chopper circuit 49 based on a self-exciting system is more generally employed than the step-down chopper circuit 40 in FIG. 10 because of less components incorporated therein as compared to those in the other types of step-down chopper circuit. Namely a case was described above where the step-down chopper circuit shown in FIG. 10 is used in the BTL amplifier device according to Embodiment 2 of the present invention, but even if the device comprises the step-down chopper circuit 49 based on the self-exciting system shown in FIG. 19, the same effect can be obtained.

Figure 20:
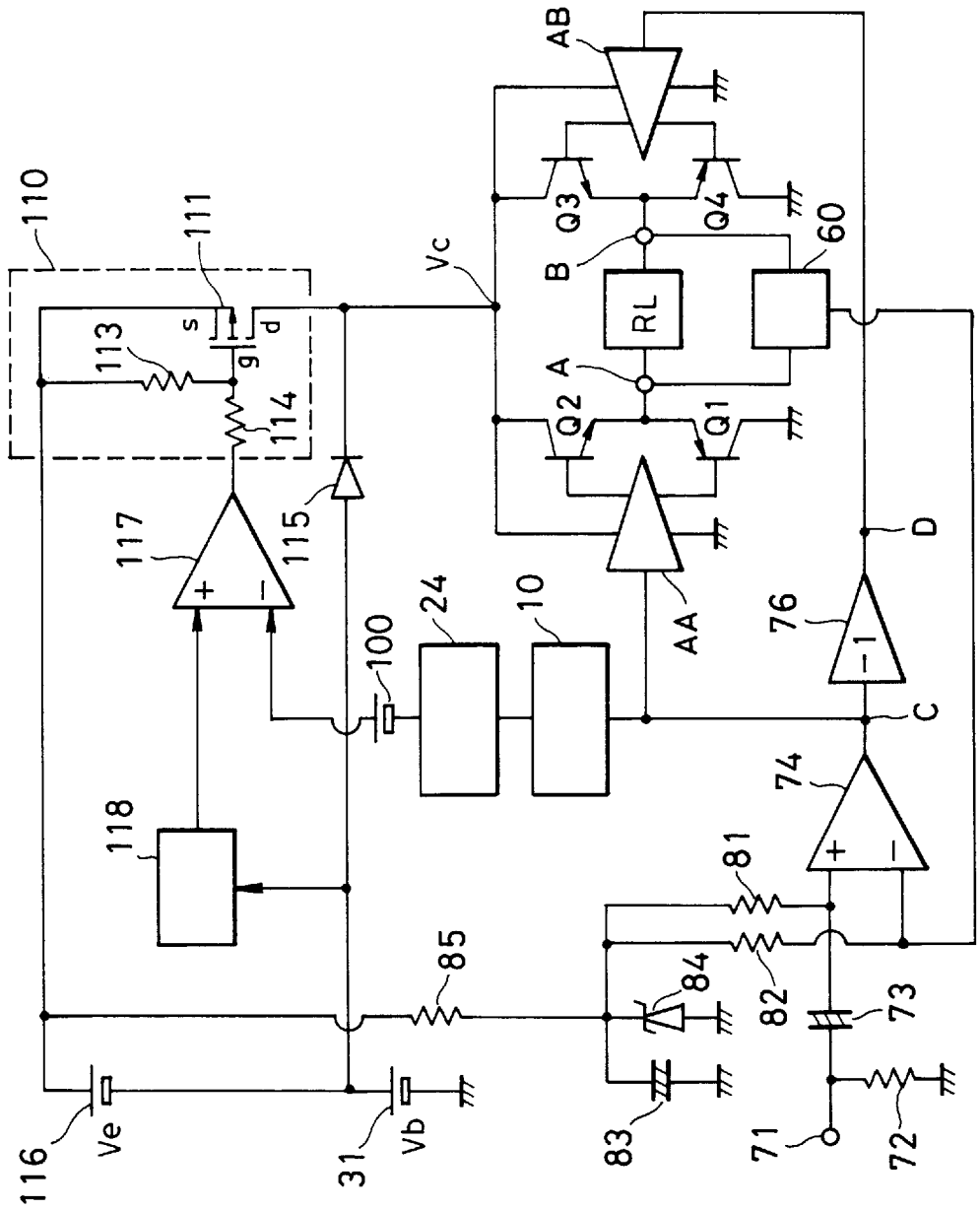
FIG. 20 is a block diagram showing a BTL amplifier device according to Embodiment 3 of the present invention.

FIG. 20 is a block diagram showing a BTL amplifier device according to Embodiment 3 of the present invention. Embodiment 3 has a big difference from Embodiments 1 and 2 in the section of the power voltage supplying circuit, so that the same reference numerals are assigned to the sections corresponding to those in Embodiments 1 and 2, and description thereof is omitted herein to avoid duplicated descriptions of the same sections.

In FIG. 20, the reference numeral 31 indicates a battery as a first voltage supply unit, and a negative polar terminal of a battery 116 as a second power voltage is connected to the positive polar terminal of this battery 31. Also, the voltage of the battery 31 is supplied from the connected point between the battery 31 and the battery 116 to the power voltage terminal of the BTL amplifier device through a diode 115 as a power voltage generating circuit. A semiconductor switch circuit 110 as a first power voltage generating circuit is inserted to a section between the positive polar terminal of the battery 116 and the cathode terminal of the diode 115.

This semiconductor switch circuit 110 comprises a PMOS type FET 111, a bias resistor 113 is connected to a section between the gate terminal and the source terminal thereof, and an output voltage from an operational amplifier 117 is supplied to the gate terminal thereof through a resistor 114. The source terminal of the FET 111 is connected to the positive polar terminal of the battery 116, and the drain terminal thereof is connected to the power voltage terminal of the BTL amplifier.

A voltage divider 118 newly provided is connected to the positive polar terminal of the battery 31, and an output voltage from the voltage divider 118 is supplied to the non-inverting input terminal (+) of the operational amplifier 117 as a control signal generating circuit. Also to the inverting input terminal (−) thereof, a voltage of a DC voltage 100 is supplied. It should be noted that a resistor 85 for a current supply to a Zener diode 84 for generating a substantially half voltage of the battery 31 is connected to the positive polar side of the battery 116.

Description is made herein for operations in Embodiment 3 of the present invention with reference to FIG. 20.

At first, the voltage supplied to the non-inverting input terminal (+) of the operational amplifier 117 is a voltage obtained by dividing the voltage of the battery 31 into 1/G by the voltage divider 118.

Namely, it is assumed that the battery voltage Vb is 12 V and G is 5 (Vb=12 V, G=5), so that the voltage supplied to the non-inverting input terminal (+) of the operational amplifier 117 is set to 2.4 V (12/5 =2.4 V).

On the other hand, a voltage to be loaded to the reversing input terminal (−) of the operational amplifier 117 is obtained by shifting the output voltage from the absolute value circuit 10 in the voltage shifting circuit 24 and correcting the shifted voltage by the DC voltage 100, and the corrected voltage is supplied thereto, but the voltage may be set to the same conditions as those previously described on the pulse width control circuit, so that a voltage of the wave form shown at the point F in FIG. 12, namely the maximum amplitude voltage of 2.4 V is loaded to the inverting input terminal (−) of the operational amplifier 117.

At first, in a case where a voltage of slightly lower than 2.4 V is supplied to the inverting input terminal (−) of the operational amplifier 117, an output from the operational amplifier 117 becomes a high voltage (Vb), so that the FET 111 is turned OFF according to the high voltage loaded to the gate terminal of the FET 111 through a resistor 114. Namely, the semiconductor switch circuit 110 is disconnected, so that the voltage of the battery 31 is supplied to the power voltage terminal of the BTL amplifier through the diode 115. Assuming the diode 115 is an ideal one, the power voltage Vc of the BTL amplifier is Vb.

Then, when the voltage supplied to the inverting input terminal (−) of the operational amplifier 117 becomes slightly higher than 2.4 V, an output from the operational amplifier 117 becomes a low voltage (0 V), so that the FET 111 is turned ON according to the low voltage loaded to the gate terminal of the FET 111.

The semiconductor switch circuit 110 is energized, and the voltage of the battery 116 is outputted through a section between the source terminal and the drain terminal of the FET 111, so that a voltage obtained by adding the voltage (Ve) of the battery 117 to the voltage (Vb) of the battery 31 is provided as a power voltage (Vc) of the BTL amplifier. For instance, assuming that the voltage of the battery 116 Ve is 12 V, the following equation can be applied:

$$Vc=Vb+Ve=12\ V+12\ V=24\ V.$$

At this point of time, the voltage at the cathode terminal of the diode 115 is 24 V, so that the diode 115 is turned OFF, and this 24 V is supplied to the power voltage of the BTL amplifier through the battery 31, the battery 116, and the semiconductor switch circuit 110.

Figure 21:
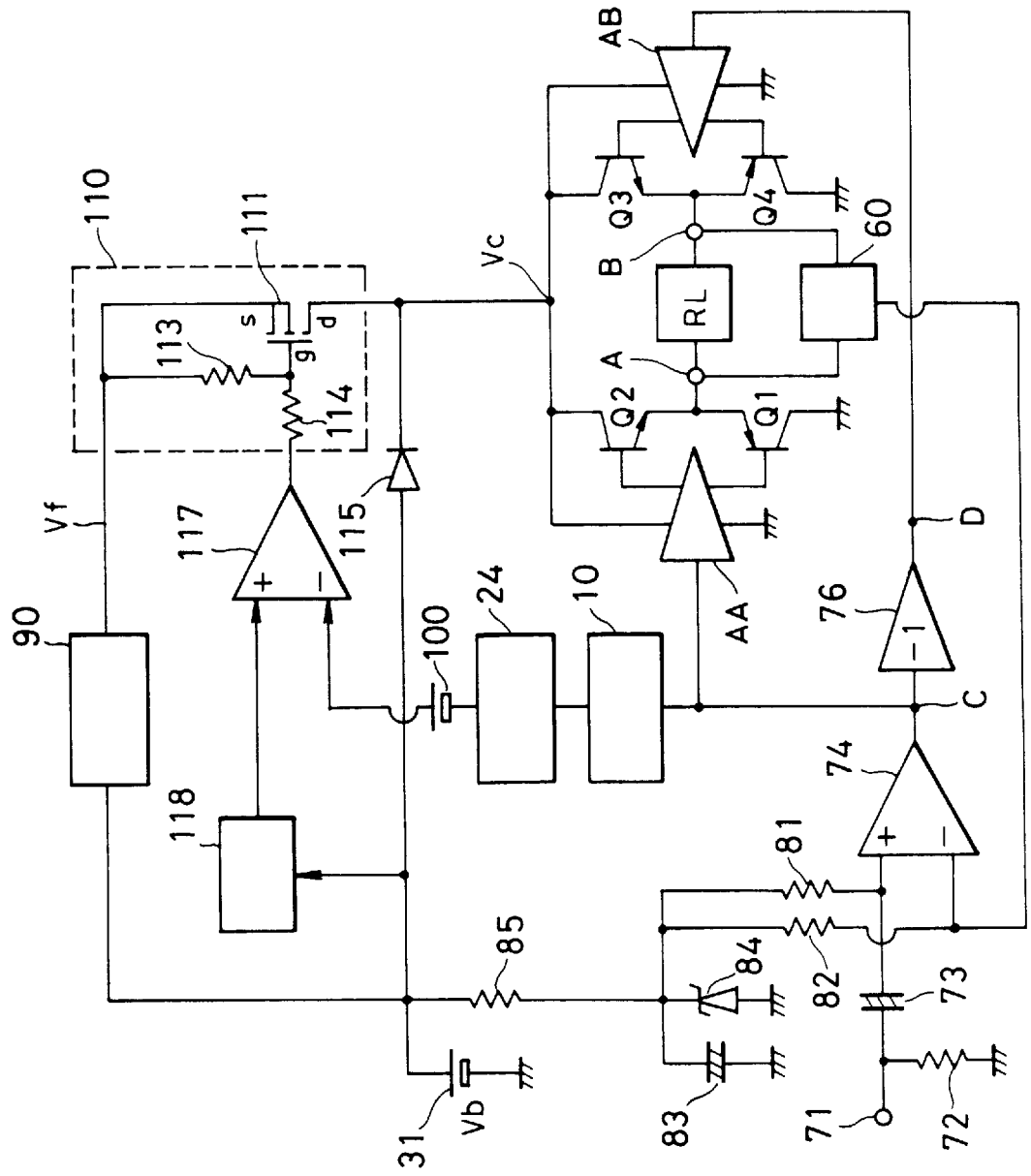
FIG. 21 is a block diagram showing a BTL amplifier device according to Embodiment 4 of the present invention.

FIG. 21 is a block diagram showing a BTL amplifier device according to Embodiment 4 of the present invention.

Embodiment 4 is different from Embodiment 3 in that a DC—DC convertor is used in place of the battery 116, and the operations in the fourth embodiment are the same as those in the third embodiment.

In FIG. 21, the input terminal of the DC—DC convertor 90 is connected to the positive side of the battery 31, while the output terminal of the DC—DC convertor 90 is connected to the source terminal of the semiconductor switch circuit 110. If an output voltage of the DC—DC convertor 90 is Vf (24 V), the following equation is applicable:

$$Vc=Vb+Vf=12\ V+24\ V=36\ V.$$

Figure 22A:
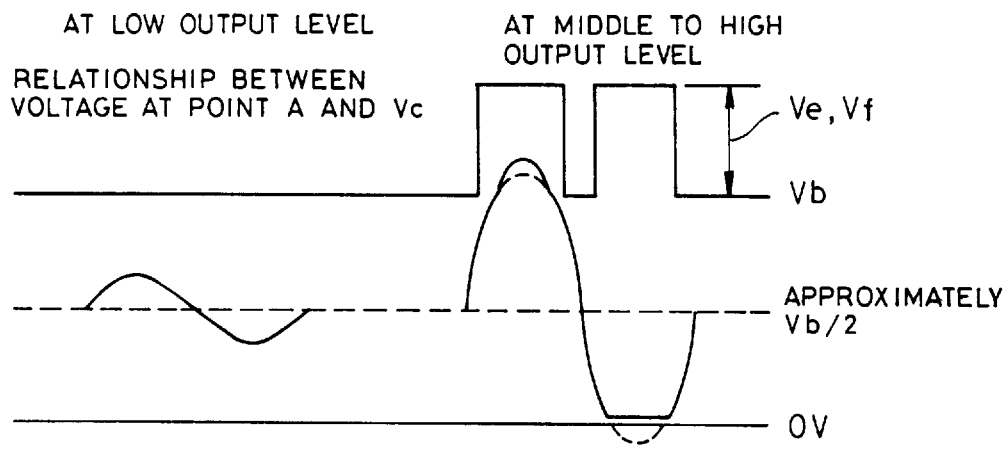
FIGS. 22a, 22b and 22c are charts showing a relation between fluctuation of a power voltage and an output voltage in the BTL amplifier device according to Embodiment 3 of the present invention.
Figure 22B:
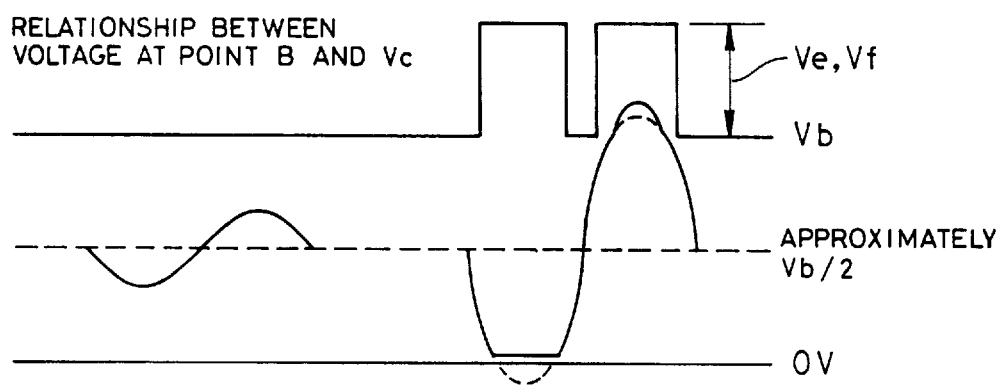
Figure 22C:
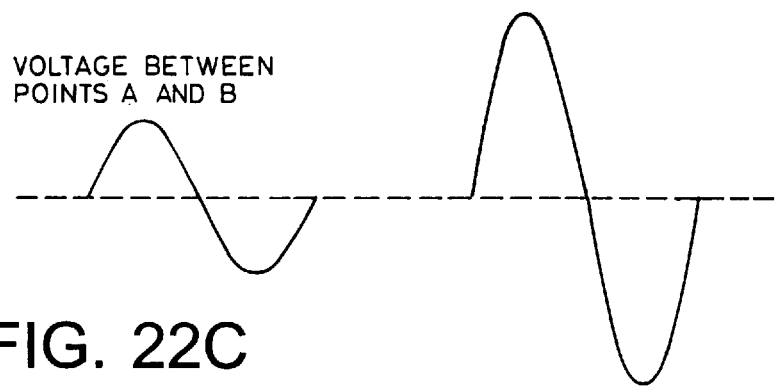

FIG. 22 shows each state of changes of the power voltage in the BTL amplifier device according to the third and fourth embodiments. FIGS. 22a and 22b show a relation between the points A, B and Vc in the figure, and FIG. 22c shows a relation of output voltages in between A and B.

As shown in FIG. 22, the semiconductor switch circuit 110 is turned ON at a simultaneous moment when an output voltage from each of the amplifiers A, B exceeds the voltage of the battery 31 as the first power voltage, whereby the voltage of the battery 116 as the second power voltage is added thereto, and the power voltage of the BTL amplifier device is switched to the high voltage. Namely, while an output voltage from each of the amplifiers A, B exceeds the voltage (Vb) of the battery 31, as a power voltage of the BTL amplifier device, a high voltage expressed by the following equation is continuously outputted:

$$Vb+Ve=24\ V\ \text{or}\ Vb+Vf=36\ V$$

These states are shown in FIGS. 22a and 22b.

Figure 23:
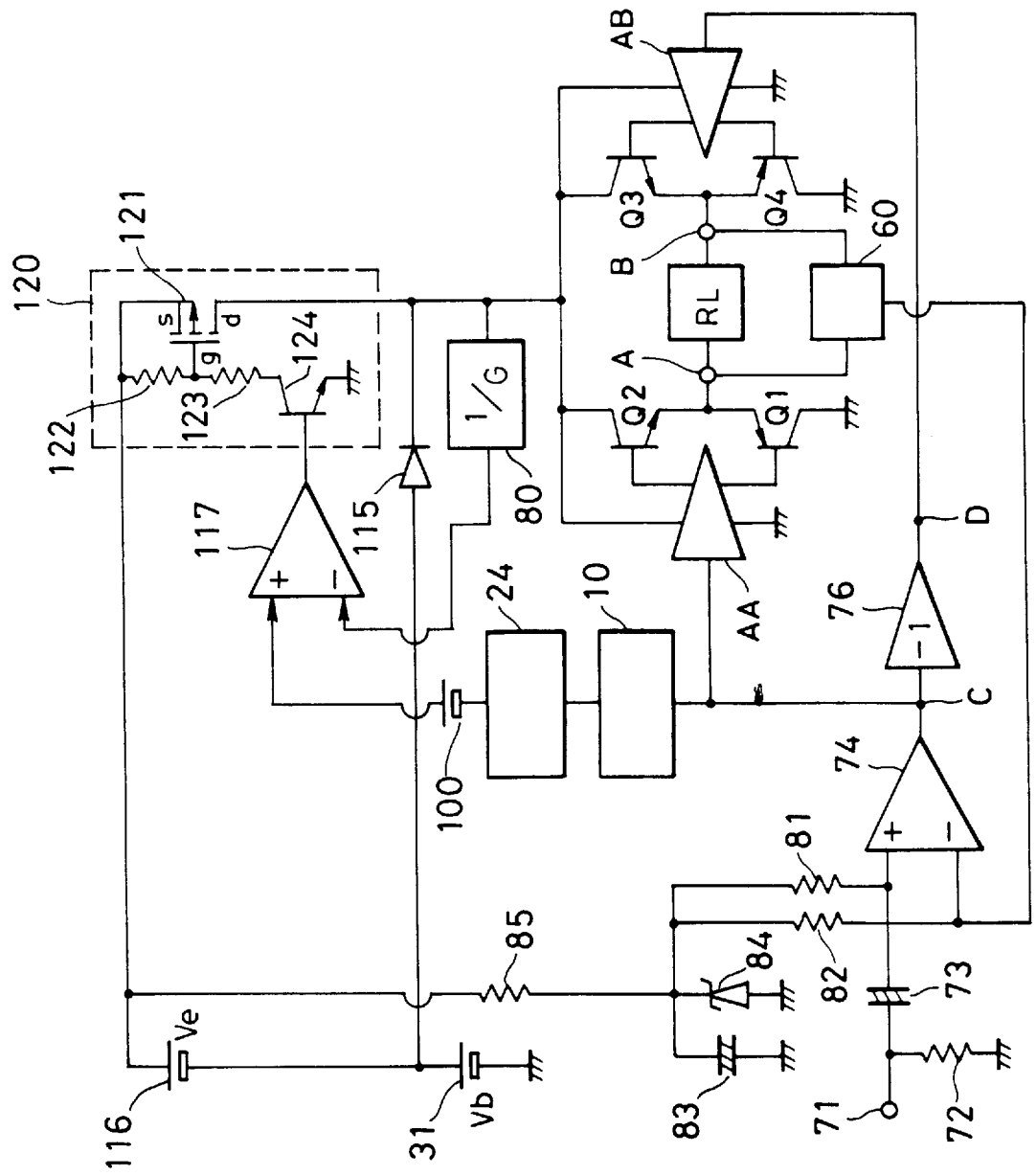
FIG. 23 is a block diagram showing a BTL amplifier device according to Embodiment 5 of the present invention.

FIG. 23 is a block diagram showing a BTL amplifier device according to Embodiment 5 of the present invention.

Embodiment 5 shown in FIG. 23 is largely different from Embodiment 3 in that a semiconductor variable element circuit 120 is used in place of the semiconductor switch circuit 110.

In FIG. 23, the semiconductor variable element circuit 120 comprises a PMOS type FET 121 and a transistor 124. A resistor 122 is connected to a section between the gate terminal and the source terminal of the FET 121, and the collector terminal of a transistor 124 is connected to the gate terminal thereof through a resistor 123. The emitter terminal of a transistor 124 is grounded, and the base terminal thereof is connected to the output terminal of the operational amplifier 117.

The source terminal of the FET 121 is connected to the positive polar terminal of the battery 116, and the drain terminal thereof is connected to the power voltage terminal of the BTL amplifier.

The voltage of the battery 31 is supplied from the connection point between the battery 31 and the battery 116 to the power voltage terminal of the BTL amplifier through the diode 115.

An output voltage from the voltage divider 80 connected to the power voltage terminal of the BTL amplifier is supplied to the inverting input terminal (−) of the operational amplifier 117. A voltage of the DC voltage source 100 is supplied to the non-inverting input terminal (+) of the operational amplifier 117.

Description is made herein for operations of the BTL amplifier device according to Embodiment 5 of the present invention.

A relation between voltages supplied to the inverting input terminal (−) of the operational amplifier 117 as well as to the non-inverting input terminal (+) thereof is the same as that based on the operational conditions in other embodiments described above, but in order to make the description simpler, it is assumed that the semiconductor variable element circuit 120 is turned OFF, and the power voltage of the BTL amplifier is supplied from the battery 31 through the diode 115.

The description is made therefor assuming that the diode 115 is an ideal one, so that the voltage of the battery 31 (Vb) is supplied to the power voltage terminal of the BTL amplifier.

The voltage supplied to the inverting input terminal (−) of the operational amplifier 117 is a voltage obtained by dividing it into 1/G by the voltage divider. Namely, 12 V /5 is 2.4 V. And in a case where a voltage slightly lower than 2.4 V is supplied to the non-inverting input terminal (+) of the operational amplifier 117, an output voltage from the operational amplifier 117 is low voltage (0 V), so that the transistor 124 is turned OFF, and the voltage of the gate terminal in the FET 121 is high voltage (Vb), whereby the FET is turned OFF. By turning the FET 121 off, the voltage of the battery 116 will never be supplied to the power voltage terminal of the BTL amplifier. Namely, the voltage of the battery 31 is supplied to the power voltage terminal of the BTL amplifier.

Then, when the voltage supplied to the non-inverting input terminal (+) of the operational amplifier 117 becomes slightly higher than 2.4 V, an output voltage from the operational amplifier 117 becomes high voltage (Vb), so that the transistor 124 is turned ON. As a result, the voltage of the gate terminal of the FET 121 is lower than that in the source terminal, whereby the FET 121 is turned ON, and impedance (resistance value) between the source terminal and the drain terminal of the FET 121 becomes smaller.

When the resistance value between the source terminal and the drain terminal of the FET 121 becomes smaller, the current of the battery 116 is flown into the power voltage terminal of the BTL amplifier according to the resistance value between the source terminal and the drain terminal thereof. Consequently the power voltage of the BTL amplifier becomes higher than that of the battery 31. This power voltage is negatively fed back to the input terminal of the operational amplifier 117 by the voltage divider 80, whereby increase of the power voltage therein is monitored.

If a case where the voltage supplied to the non-reversing input terminal (+) of the operational amplifier 117 is set, for instance, to 3.0 V is to be considered, it is understood that an output voltage from of the operational amplifier 117 becomes high, whereby the transistor 124 and the FET 121 are turned ON.

Then, when the resistance value of the semiconductor variable element circuit 120 becomes smaller, the current of the battery 116 is flown into the power voltage terminal of the BTL amplifier, which causes the voltage of the power voltage terminal to become higher. Then, when the voltage of the power voltage terminal reaches 15 V, namely when an output voltage from the voltage divider 80 becomes 15/5= 3.0 V, the negative feed back circuit comprising the operational amplifier 117, semiconductor variable element circuit 120 and voltage divider 80 is stabilized.

Namely the power voltage of the BTL amplifier has been made higher from 12 V to 15 V.

If a case where the voltage supplied to the non-reversing input terminal (+) of the operational amplifier 117 becomes, for instance, 4.0 V is to be considered, it is understood that the transistor 124 and the FET 121 are turned ON like in the operations described above, and when an out voltage from the semiconductor variable element circuit 120 reaches 20 V, namely when an output voltage from the voltage divider 80 becomes 20/5=4.0 V, the negative feed back circuit comprising the operational amplifier 117, semiconductor variable element circuit 120 and voltage divider 80 is stabilized.

Figure 24:
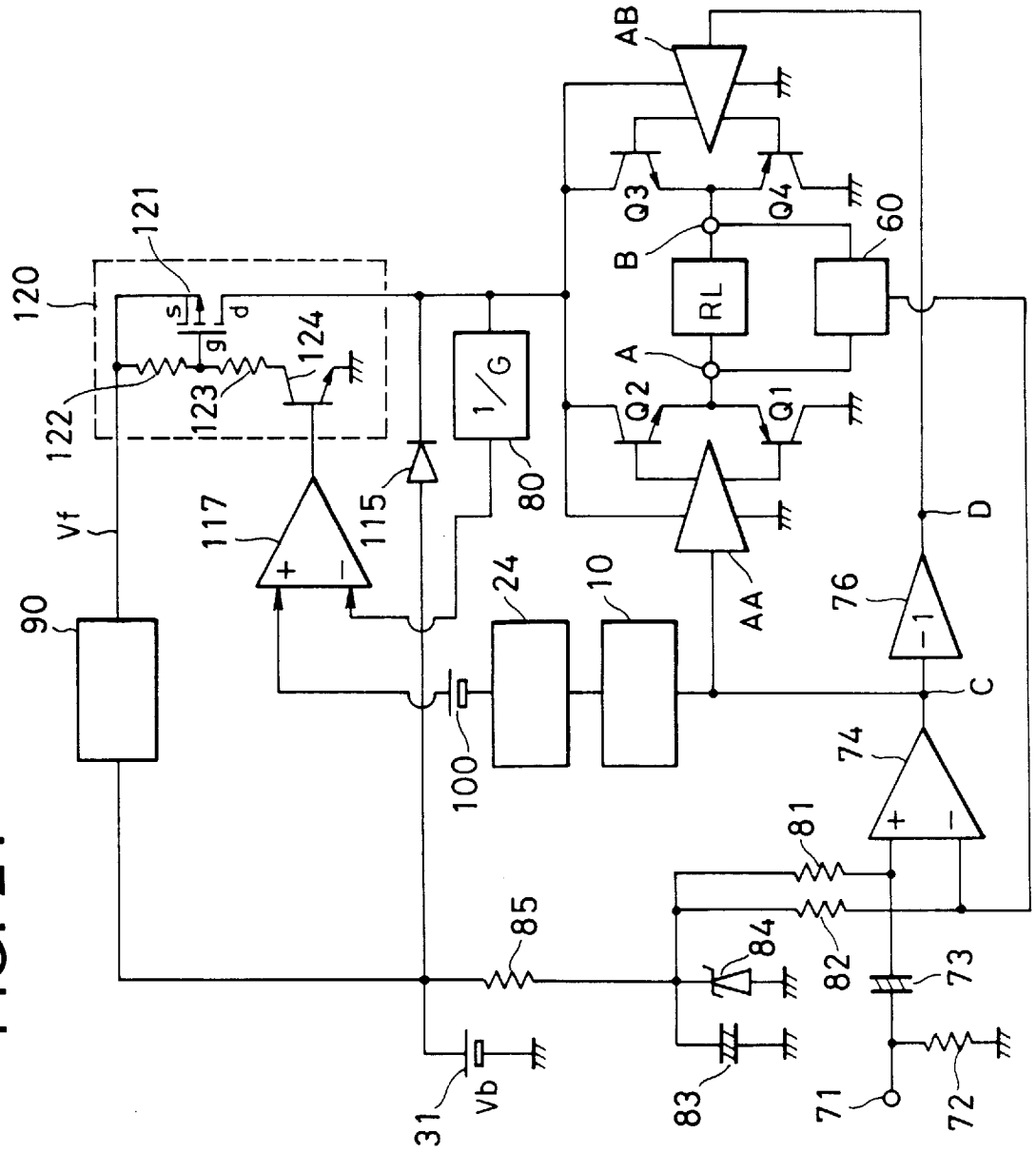
FIG. 24 is a block diagram showing a BTL amplifier device according to Embodiment 6 of the present invention.

FIG. 24 is a block diagram showing a BTL amplifier device according to Embodiment 6 of the present invention.

Embodiment 6 is largely different from Embodiment 5 in that the DC—DC convertor 90 is used in place of the battery 116, but operations other than the difference described above is the same as those in Embodiment 5, so that description thereof is omitted herein.

As described above, in the BTL amplifier according to either of Embodiments 5 and 6 of the present invention, an absolute value of the output voltage from the operational amplifier 74 is obtained in the absolute value circuit 10, and the obtained value is shifted to the other level in the voltage shifting circuit 24. Then the voltage obtained by adding a DC voltage (Vth/G) as a portion to be supplied of the power voltage to the shifted voltage is supplied to the non-inverting input terminal (+) of the operational amplifier 117, and the supplied voltage is made to a controlled voltage for the power voltage supplying circuit, whereby the voltage of the power voltage terminal of the BTL amplifier is linearly varied from Vb to Ve (Vf) according to an output signal outputted to the output terminal of the amplifiers A, B, and the varied voltage can be supplied. At this point of time,the relation between the points A, B of the output terminals in the amplifiers A,B and the power voltage (Vc) is operated as that shown in FIG. 17 relating to Embodiment 1.

Figure 25:
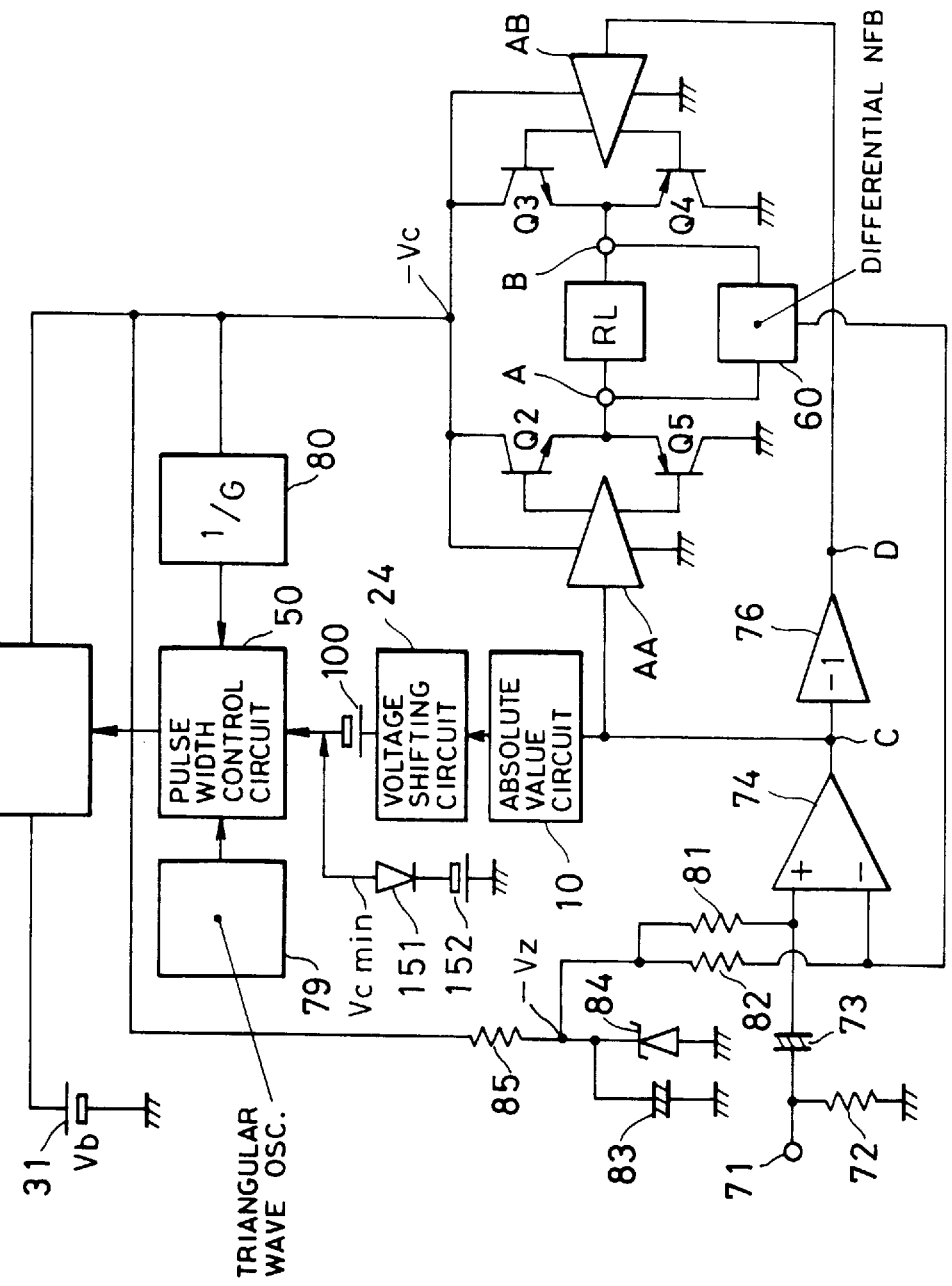
FIG. 25 is a block diagram showing a BTL amplifier device according to Embodiment 7 of the present invention.

FIG. 25 is a block diagram showing a BTL amplifier device according to Embodiment 7 of the present invention.

Embodiment 7 is largely different from Embodiment 1 or Embodiment 2 in that a step-up/ step-down chopper circuit 150 is employed for the power voltage supplying circuit of the BTL amplifier.

Description is made for operations of the step-up/step-down chopper circuit 150 with reference to FIG. 26 before description is made for operations of the BTL amplifier according to Embodiment 7 of the present invention.

As shown in FIG. 26, the battery 31 is connected to the source terminal of the PMOS type FET 41, and the coil 32 is connected to a section between the drain terminal thereof and the ground. The cathode side of the diode 42 is connected to the drain terminal thereof, while the anode side of the diode is connected to the output terminal 39, and is also grounded through the capacitor 37 and the load resistor 38. The collector terminal of the transistor 44 is connected to the gate terminal of the FET 41, and the bias resistor 45 is connected to a section between the gate terminal and source terminal thereof. The emitter terminal of the transistor 44 is connected to the ground, and the base terminal thereof is grounded through the resistor 46, and is also connected to the input terminal 35 through the resistor 47.

Description is made herein for the step-up/step-down chopper circuit 150, but description of the sections already described in relation to the step-up chopper circuit 30 or the step-down chopper circuit 40 is omitted herein to avoid duplication.

FIG. 27*a* shows a pulse signal generated in the pulse width control circuit 50 which is supplied to the input terminal 35 of the step-up/step-down chopper circuit 150. The FET 41 is turned ON while the transistor 44 is conducting, and the current of the battery 31 is supplied to the coil 32 for storage.

Then, when the transistor 33 is turned OFF and the FET 41 is disconnected,the current stored in the coil 32 works as a back electromotive force of the coil 32, and is flown in the direction indicated by the arrow in the figure through the resistor 38, so that a negative voltage to the polarity of the battery 31 is generated in the output terminal 38. FIG. 27*b* shows a state of the output voltage generated in the output terminal 38 when the capacitor 37 is not provided therein, and FIG. 27*d* shows a wave form of the output voltage when the voltage is subjected to smoothing by the capacitor 37. In the step-up/step-down chopper circuit 150, when the FET 41 is disconnected, the battery 31 is separated from the coil 32, so that a back electromotive force (−2 to −3 Vb) of the coil 32 substantially twice or three times as larger as the voltage of the battery 31 is generated if a period of time when the voltage supplied to the coil 32 is long, however, in a case where the period of time is short or in a case where the pulse voltage is not supplied to the coil,the back electromotive force works an output voltage of substantially 0 V. For this reason, it is required to set a minimum voltage (−Vcmin) of the power voltage supplied to the amplifier and to always supply a pulse voltage having a pulse width required for obtaining this −Vcmin.

Description is made for operations of the BTL amplifier device according to Embodiment 7 of the present invention with reference to FIG. 25. As shown in FIG. 25, in a case where a positive voltage of the battery 31 is supplied as a power for the step-up/step-down chopper circuit 150, a negative voltage is generated in the output voltage of the step-up/step-down chopper circuit 150, so that the Zener diode 84 is provided reversely to that in other embodiment to make the entire value circuit change to a negative voltage, and the negative voltage is supplied from the output terminal 39 of the step-up/step-down chopper circuit 150 to the Zener diode 84 through the resistor 85. It is assumed in the following description that the Zener voltage obtained herein is −Vz.

As a pulse voltage is always required in the step-up/step-down chopper circuit 150 as described above, a fixed voltage circuit comprising a diode 151 and a battery 152 is provided in the control input terminal 51 (shown in FIG. 12) of the pulse width control circuit 50 as shown in FIG. 25.

A voltage of this fixed voltage circuit is set to a voltage value corresponding to a voltage, for instance, a voltage (V1) shown in FIG. 13*a*. Namely, a voltage fluctuated according to an input signal is supplied from the absolute value circuit 10, the voltage shifting circuit 24, and the DC voltage source 100 to the control input terminal 51 of the pulse width control circuit 50, but the voltage is fixed to a voltage of the fixed voltage circuit until the voltage reaches the voltage value corresponding to the voltage (V1) described above, so that a signal with a pulse width shown in FIG. 13b is outputted to the output terminal of the pulse width control signal 5. Then, when the input signal becomes large and a value of a voltage supplied via the absolute value circuit 10, the voltage shifting circuit 24, and the DC voltage source 100 becomes higher than that of the fixed voltage circuit, the voltage change from (V1) to (V2) is generated according to this voltage value, so that a pulse signal with a changes pulse width is outputted.

Figure 28A:
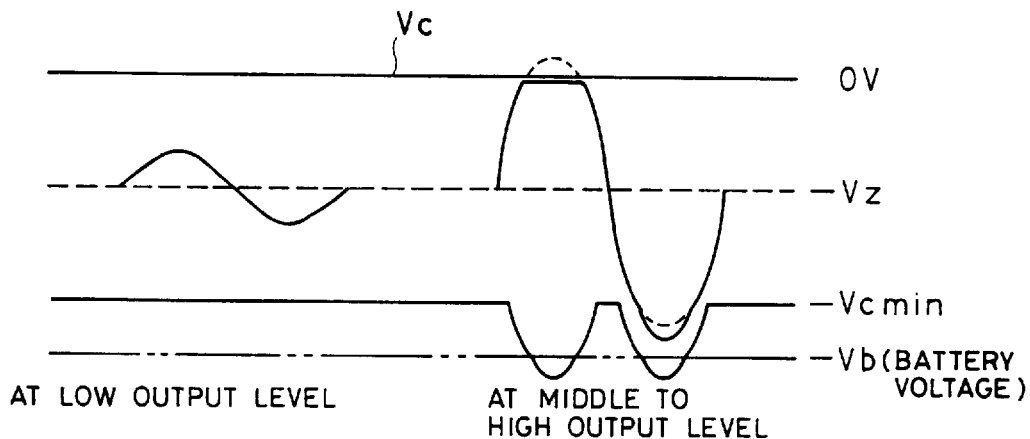
FIGS. 28a and 28b are charts showing a relation between fluctuation of a power voltage and an output voltage in the BTL amplifier device according to Embodiment 7 of the present invention.
Figure 28B:
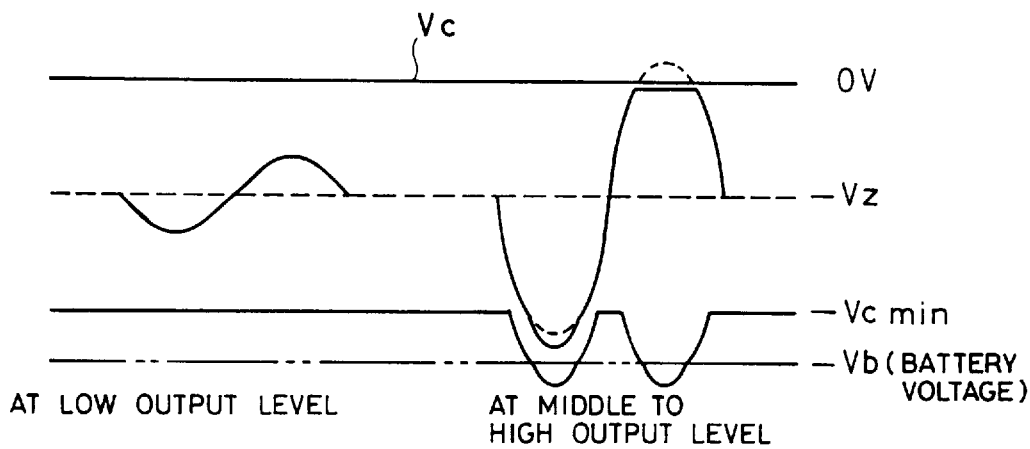

FIG. 28 shows a relation between an output from the BTL amplifier device and a power voltage (−Vc), and if a maximum voltage (−Vcmin) with which the power voltage is controlled is set to, for instance, −6 V, the Zener voltage of the Zener diode 84 is set to substantially −3 V. If an output signal becomes larger, the power voltage (−Vc) is controlled as shown in the parts (a) and (b) of FIG. 28, and is also controlled up to the voltage corresponding to that substantially twice to three times as larger as the voltage value (Vb) of the battery 31 according to the output signal.

Figure 29:
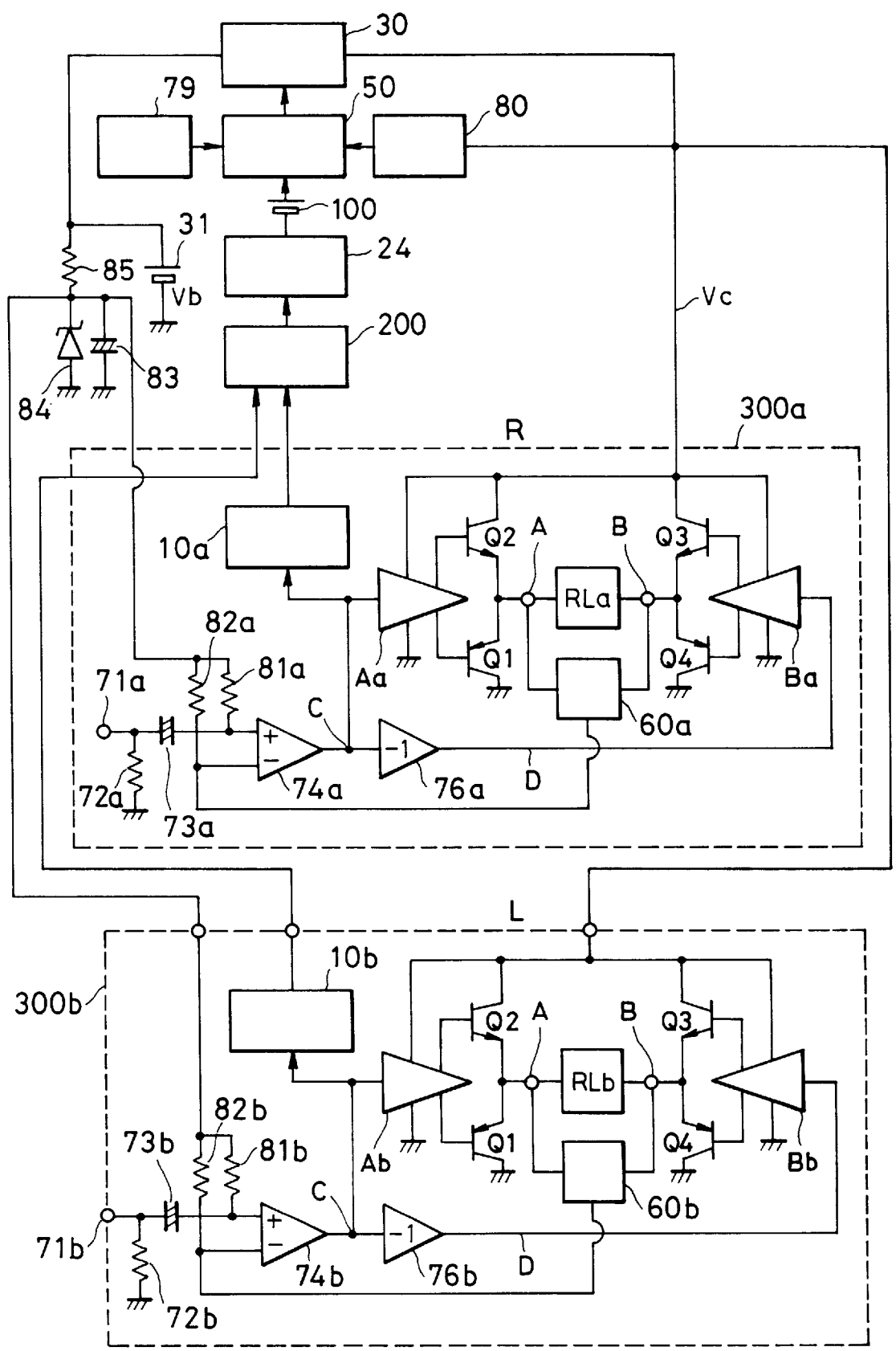
FIG. 29 is a block diagram showing a BTL amplifier device according to Embodiment 8 of the present invention.

FIG. 29 is a block diagram showing a BTL amplifier device according to Embodiment 8 of the present invention. Although all of Embodiments 1 to 7 have been described assuming a case where one type of power voltage supplying circuit is used in one unit of amplifier, Embodiment 8 has the configuration in which, as shown in FIG. 3 relating to Embodiment 1, a maximum value detecting circuit 200 is additionally inserted to a section between the absolute value circuit 10 and the voltage shifting circuit 24 and a plurality of amplifiers can be supported by one unit of power voltage supplying circuit. Namely FIG. 29 shows a case of two-channel configuration in which two blocks of BTL basic circuit are provided in a circuit block such as the step-up chopper circuit 30, battery 31, pulse width control circuit 50, triangular oscillator 79, and voltage divider 80 or the like each commonly used as a power voltage supplying circuit, or in a fixed power source (capacitor 83 is included) circuit such as an operational amplifier obtained by supplying a current from the battery 31 to the Zener diode 84 through the resistor 85.

As described on the operations in Embodiment 1, in a case where the maximum amplitude generated in the load resistor RL exceeds the power voltage Vc supplied, an output voltage from the operational amplifier 74 largely extends than that in a case where the maximum amplitude therein does not exceed that of the power voltage as shown in FIG. 16. As shown in FIG. 29, in a case where a BTL basic circuit 300a provided in the upper side in the figure is, for instance, a R-channel and a BTL basic circuit 300b provided in the lower side therein is, for instance, an L-channel, and if the maximum amplitude in one of the channels exceeds that of the power voltage, there will occur a difference between an output voltage from either of the absolute value circuit 10a or 10b and that from the other one each provided in the BTL basic circuit 300. Namely, in the channel in the side where the maximum amplitude generated in the load resistor RL has exceeded that of the power voltage, some distortion is generated, so that larger power voltage is required. In addition, the output voltage in the absolute value circuit 10 in the channel side in which the distortion has been generated is larger than that in the absolute value circuit 10 in the channel opposite thereto in which distortion is not generated.

Figure 30:
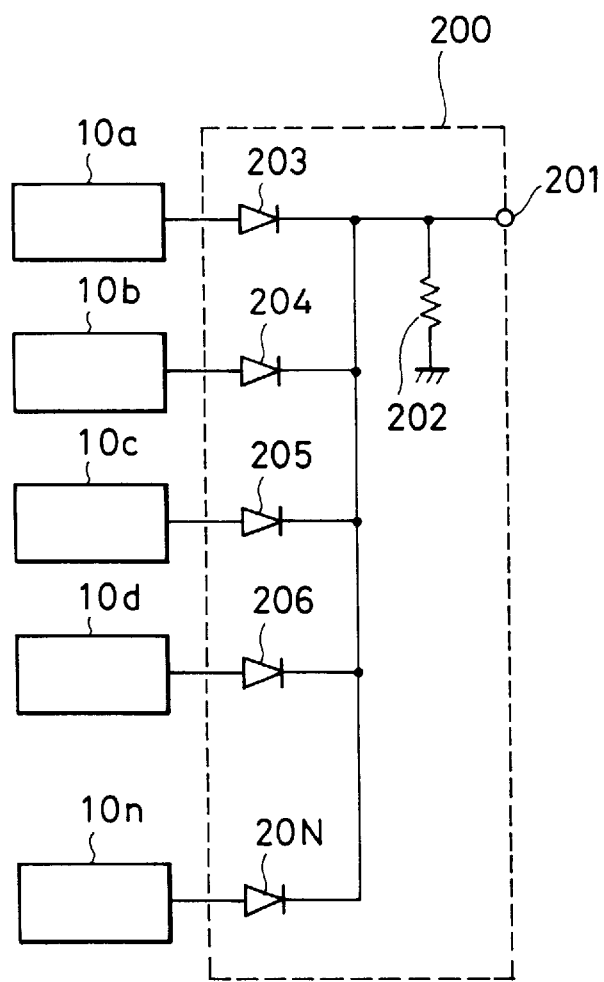
FIG. 30 is a block diagram showing a maximum value detecting circuit used for the BTL amplifier device according to Embodiment 8 of the present invention.

An output voltage from each of two units of amplifier 10a and 10b provided in each of the BTL basic circuit 300 is supplied to the maximum value detecting circuit 200 newly provided in the device according to this embodiment of the present invention, and the voltage shifting circuit 24 is controlled by the output voltage value larger between output voltages from the absolute value circuit 10a and 10b respectively in Embodiment 8. FIG. 30 shows configuration of the circuit in this maximum value detecting circuit 200. As shown in FIG. 30, the maximum value detecting circuit 200 is an OR circuit comprising, for instance, a plurality of diodes and a resistor. As shown in FIG. 30, a plurality of diodes 203 to 20N and a resistor 202 are provided in the maximum value detecting circuit 200, and in a case where the voltage supplied from, for instance, the absolute value circuit 10a shows the maximum value among voltage supplied thereto from other absolute value circuits 10b to 10n, an output voltage from the cathode terminal of the diode 203, namely from an output terminal 201 of the maximum value detecting circuit 200 becomes higher than a voltage generated in any of the cathode terminals of the diodes 203 to 20N from other absolute value circuits 10b to 10n, so that each of the diodes 203 to 20N is turned OFF, and an output voltage from the output terminal 201 of the detecting circuit 200 is the voltage supplied from the absolute value circuit 10a.

It should be noted that the maximum value detecting circuit 200 may comprise a analog OR circuit such as a transistor and an IC or the like.

In FIG. 29, in a case where a larger signal is inputted into an input terminal 71b of the BTL basic circuit 300b for the L-channel as a musical signal described above as compared to that into input terminal 71a of the BTL basic circuit 300b for the R-channel and the maximum value of the output amplitude generated at both edges of the load resistor RLb of the BTL basic circuit 300b exceeds the power voltage Vc, even if an output amplitude generated at both edges of the load resistor RLa in the side of the BLT basic circuit 300a for the R channel is small, a wave form of an output voltage from the operational amplifier 74b provided in the BTL basic circuit 300b becomes like an extended one of a wave form of an output voltage from the amplifier Bb (Ab) corresponding to the portion in which an output voltage from the amplifier Ab (Bb) is extended like FIG. 16a. For this reason, an absolute value of the output voltage from the operational amplifier 74b is obtained by the absolute value circuit 10b, and when the obtained absolute value is level-shifted in the voltage shifting circuit 24 to provide the wave form shown in FIG. 16b. The output voltage from the absolute value circuit 10b is supplied to the maximum value detecting circuit 200 newly provide. The output voltage from the absolute value circuit 10a in the BTL basic circuit 300a for the R-channel is also supplied to the maximum value detecting circuit 200, however, the output voltage from the absolute value circuit 10b is higher than the output voltage from the absolute value circuit 10a, so that the output voltage value from the absolute value circuit 10b is supplied to the voltage shifting circuit 24 according to the operation of the maximum value detecting circuit 200, further the DC voltage 100 is added thereto and is supplied to the pulse width control circuit 50, whereby the power voltage of the entire BTL amplifier device is controlled so that the voltage will be a power voltage Vc required for the BTL basic circuit 800b for the L-channel.

Figure 31:
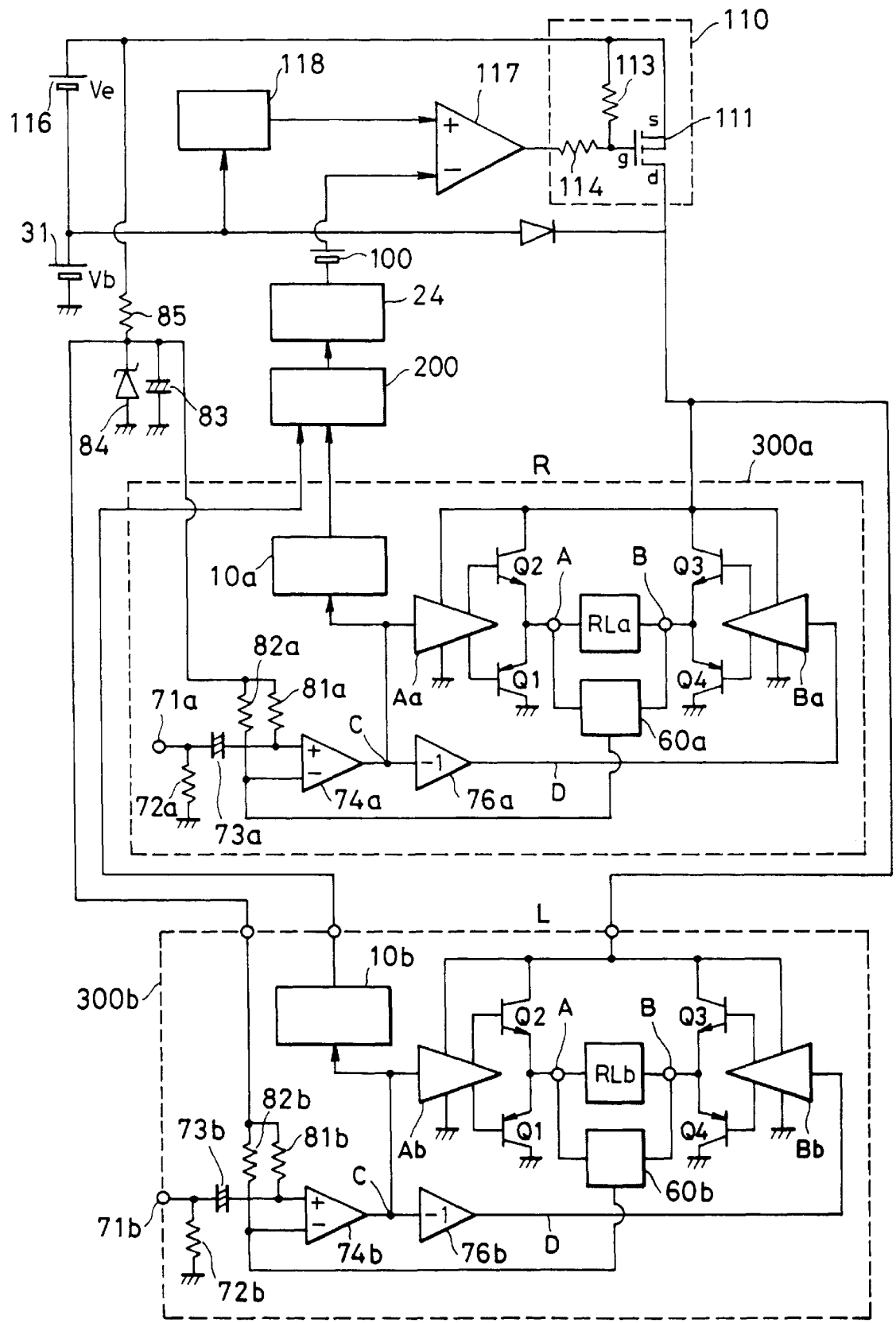
FIG. 31 is a block diagram showing a BTL amplifier device according to Embodiment 9 of the present invention.

Embodiment 8 of the present invention is described using a case of two channels therein, and it is needless to say that the present invention is not limited to the two channels, and can be applied to a multi-channeled BTL amplifier such as a four-channeled one or the like. The multi-channeled BTL amplifier according to Embodiment 3 described above may be applied to each of the embodiments shown in FIG. 20, FIG. 21, FIG. 23, and FIG. 24. FIG. 31 shows Embodiment 9 to which the configuration shown in FIG. 20 is applied.

In the BTL amplifier device according to any of Embodiments 1 to 8 of the present invention, the description was made assuming that each of the circuit elements was operated in an ideal state.

Actually, for instance, a voltage between the collector and the emitter of a transistor, namely a voltage Vce between the collector and the emitter thereof generated when the transistor is in the conductive stage is ineffective to the power voltage. For instance, if Vce is 1 V, the transistors Q2 and Q4 is turned ON for a voltage in a half cycle of the positive side of a sinusoidal wave are turned ON, so that an ineffective voltage becomes 2 V, and for this reason only the maximum output amplitude of can be outputted by only 10 V when the power voltage is 12 V.

Accordingly, a correct voltage (Vth/G) used for the DC voltage 100 is required to be set to a voltage including therein this ineffective voltage. Namely, the correct voltage (Vth/G) generated in the DC voltage source 100 is a voltage for deciding from what voltage a maximum amplitude to be outputted is restricted by the power voltage, so that the correct voltage is set according to a relation between the maximum amplitude of an input signal into the absolute value circuit 10 and the maximum output voltage when the maximum amplitude is restricted by the power voltage.

In the step-up chopper circuit 30, when a pulse voltage is not supplied to the input terminal thereof, the diode 36 is conducted, so that the output voltage from the diode 36 is reduced by the voltage (Vd=0.6 V) in the forward direction thereof. This voltage works as an ineffective voltage in the step-up chopper circuit 30.

Similarly in the diode 115 for a power voltage used from Embodiment 3 to Embodiment 6, the output voltage from the diode 115 is reduced by the voltage in the forward direction (Vd=0.6 V). Namely the power voltage is 11.4 V which is obtained by the following calculation: 12 V−0.6= 11.4 V. Then, this voltage is divided to 1/a gain (1/G), so that an output voltage from the voltage divider 80 or the voltage divider 118 is 2.28 V, not 2.4 V. For this reason, it is required to set 0.12 V as a difference between the voltages to a correct voltage in the semiconductor switch circuit 110 and the semiconductor variable element circuit 120. The DC voltage 100 used in the embodiment of the present invention is set in consideration of all ineffective voltages which circuit elements have as described above.

The BTL amplifier device according to any of Embodiments 1, 2, 7, and 8 of the present invention was described with the absolute value circuit shown in FIG. 4, but the device may comprise a double-wave rectifier having a diode bridge or the like in place of the absolute value circuit, and even if the device comprises a half-wave rectifier having a diode which is provided in each of the point C and the reversing amplifier 76 (point D) respectively and with a signal obtained by synthesizing output voltages from the circuits, the same effect can be obtained. As a DC voltage source is not superimposed on the output voltage in this point of time, it is required to set a new correct voltage in the voltage shifting circuit.

The BTL amplifier device according to Embodiment 2 of the present invention was described with the step-down chopper circuit shown in FIG. 10, but even if the device comprise the step-down chopper circuit base on a self-exciting system shown in FIG. 19, the same effect can be obtained.

The BTL amplifier device according to any of Embodiments 1, 2, 7, and 8 of the present invention was described with an example using the battery, but the device is not limited to the battery and any device may be employed if a DC current as Vb can be supplied to the device. The device was described with the configuration of the circuit comprising one unit of power supply, but the effect over the present invention is not lost even if the circuit comprises two power supplies of positive and negative polarities.

In the BTL amplifier device according to the present invention, in Embodiments 1, 2, 7, and 8, a circuit constant is set so that a speed of response in the step-up chopper circuit 30 and the step-down chopper circuit 40 will be high, and in Embodiments 3 to 6, a speed of response in the semiconductor switch 110 and the semiconductor variable element circuit 120 based on the operational amplifier 117 will be high, but, in a case where the response speed described above is delayed in a high frequency domain and a change of a power voltage does not follow a change of an output signal, it is possible to deal with the problem described above by providing a circuit therein for changing the operations of response in the high frequency domain.

Figure 32:
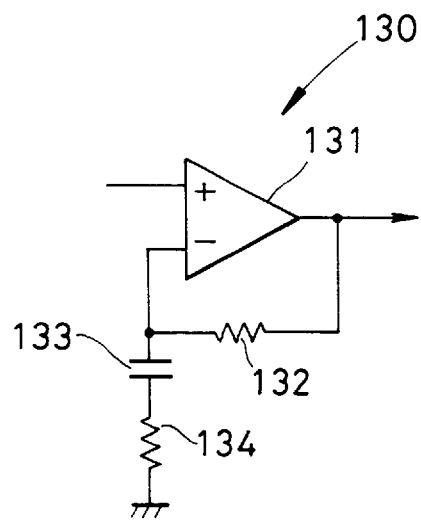
FIG. 32 is a view showing a frequency characteristics control circuit.

FIG. 32 shows a frequency characteristics control circuit 130 with an operational amplifier. In the frequency characteristics control circuit 130, a feed-back resistor 132 from the output terminal of the operational amplifier 131 to the reversing input terminal, a capacitor 133, and a resistor 134 constitute a lag-grid filter.

Figure 33:
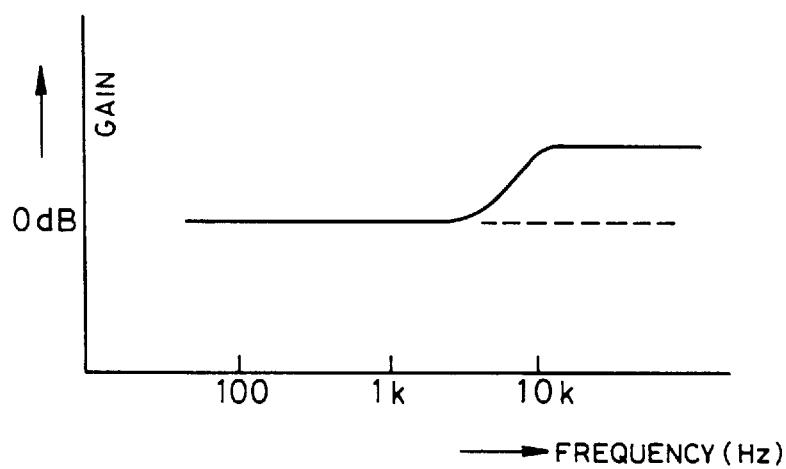
FIG. 33 is a chart showing frequency characteristics of the circuit shown in FIG. 32.

FIG. 33 shows the frequency characteristics of the frequency characteristics control circuit 130.

In FIG. 33, the Y-axis shows a gain of the frequency characteristics control circuit 130, while the X-axis shows a frequency. As shown in FIG. 33, a frequency more than 10 KHz has a required gain. By inserting this frequency characteristics control circuit 130 to the side of input terminal of the absolute value circuit 10 (between the output terminal of the operational amplifier 74 and the input terminal of the absolute value circuit 10), the circuit is operated as described above in the low frequency domain, but a higher gain than an input signal from each of the amplifiers A and B is set in the high frequency domain, so that the power voltage is started to be controlled at an earlier stage than that of the controlled voltage (2.4 V) initially set. Namely, it is possible to correct a delay of time for operation in the high frequency domain. It should be noted that the same effect can be obtained even if the frequency characteristics control circuit 130 is connected to the side of the output terminal of the absolute value signal 10 (between the output terminal of the absolute value circuit 10 and the input terminal of the voltage shifting circuit 24).

Figure 34A:
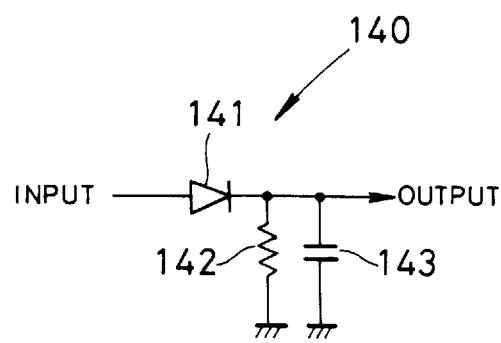
FIGS. 34a, 34b, 34c, 34d and 34e are charts showing a relation between an input and an output signals in the wave form shaping circuit as well as in the frequency domain.
Figure 34B:
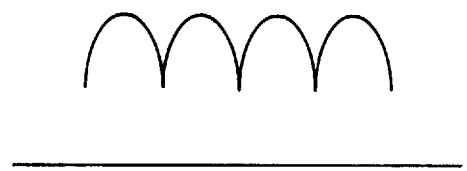
Figure 34C:
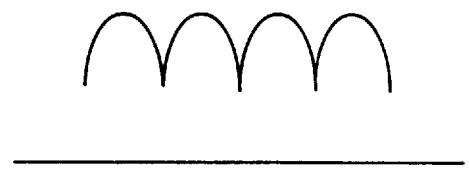
Figure 34D:
Figure 34E:
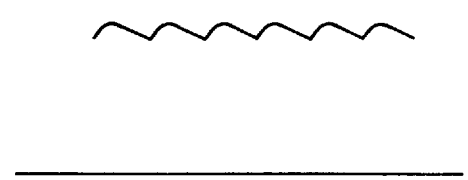

FIG. 34a shows a waveform-rectifying circuit 140. This waveform-rectifying circuit 140 charges a signal subjected to half-wave rectification by a diode 141 in the capacitor 143 and makes a resistor charge, so that, in a case where the signal supplied to the input terminal of the waveform rectifier 140 is a low frequency as shown in FIG. 34b, an output signal substantially identical to the input signal as shown in FIG. 34c can be obtained. However, when a high frequency shown in FIG. 34d is supplied as an input signal, the discharge characteristics is delayed according to the constant of the capacitor 143 as well as of the resistor 142 in the waveform rectifier 140 as shown in FIG. 34e. Namely, by setting a recovery time when the signal is discharged through the resistor 142 to a value larger than an attack time when it is subjected to half-wave rectification by the diode 141, a wave form of an output voltage is delayed in following the output signal in the high frequency domain, and for this reason, an average voltage of an amplitude therein becomes higher as compared to that in the low frequency domain. And for this reason, by inserting the waveform rectifier 140 to the side of the output terminal of the DC voltage source 100, deviation of the power voltage can be maintained in a state close to the peak value of the output signal because the delay of the discharge characteristics is generated in the high frequency domain, so that it is impossible to lack a part of an output wave form due to delay of the power voltage to the signal in the high frequency domain.

With the BTL amplifier device according to Embodiment 1 of the present invention, a voltage is stepped up by the step-up chopper circuit and is supplied to only the input signal having a voltage more than that of an output voltage restricted by the power voltage, so that power consumption of the step-up chopper circuit is low when the output power is low, which makes it possible to provide a BTL amplifier device with low power consumption and high efficiency.

With the BTL amplifier device according to Embodiment 2 of the present invention, a power voltage is stepped down when the output power is low, which makes it possible to provide a BTL amplifier device with low power consumption and high efficiency.

With the BTL amplifier device according to any of Embodiments 3, 4 of the present invention, the second power voltage is supplied to only the input signal having a voltage more than that of an output voltage restricted by the voltage in the first power voltage, so that the device operates with only the first power voltage when the output power is low, and for this reason power consumption due to the second power voltage is low, which makes it possible to provide a BTL amplifier device with low power consumption and high efficiency.

With the BTL amplifier device according to any of Embodiments 5, 6 of the present invention, a power voltage required for following the output voltage is supplied from the second power voltage to only the input signal having a voltage more than that of an output voltage restricted by the voltage in the first power voltage, so that it is possible to provide a BTL amplifier device with low power consumption and high efficiency.

With the BTL amplifier device according to Embodiment 7 of the present invention, a power voltage is set to a voltage less than a battery voltage, and if an output voltage is restricted by the power voltage, it is possible to continuously change the power voltage from the voltage less than the battery voltage to a voltage more than the battery voltage for a supply, so that power consumption can be suppressed when an output power is low and even when the output power is high, it is possible to provide a BTL amplifier device with low power consumption and high efficiency.

With the BTL amplifier device according to any of Embodiments 8, 9 of the present invention, by providing the maximum value detecting circuit 200 therein, one unit of power voltage control circuit may be provided therein to a plurality of amplifiers, which makes configuration of the circuit simpler.

Detailed description has been made for the preferred embodiments of the present invention with reference to the related drawings as described above. It is considered that various changes and modifications are conceivable for persons skilled in the art, and it is intended by the applicant that such modifications and modified examples falling within the scope of the present invention be covered by the appended claims.

What is claimed is:

1. A balanced transformer less (BTL) amplifier device comprising:

first and second amplifiers to which an input signal and a signal obtained by inverting the input signal are supplied respectively, the first and second amplifiers constituting a BTL circuit;

a power voltage supplying circuit for generating an output voltage according to a control signal and supplying the output voltage to the first and second amplifiers as a power voltage;

a load connected to between output terminals of the first and second amplifiers;

a load voltage detecting circuit for detecting voltages at both edges of the load;

a negative feedback circuit for negatively feeding back the output voltage from the load voltage detecting circuit to the input signal side of the BTL circuit;

an absolute value circuit for outputting an absolute value of the output voltage on the input signal side of the BTL circuit; and a control signal generating circuit for generating the control signal according to a difference between an output voltage from the absolute value circuit and an output voltage from the power voltage supplying circuit.

2. A BTL amplifier device as claimed in claim 1, wherein the power voltage supplying circuit comprises:

a step-down type of chopper circuit, wherein the chopper circuit comprises:

a DC voltage source;

an opening/closing means and a coil serially connected to a section between one edge of the DC voltage source and an output terminal to which the output voltage is guided and outputted;

a diode connected to a section between a point of connecting the opening/closing means to the coil and the other edge of the DC voltage source; and a capacitor for storing a back electromotive force generated in the coil connected to a section between the output terminal and the other edge of the DC voltage source; and the control signal generating circuit generates a control signal with a pulse width according to a difference between an output value from the power voltage supplying circuit, and the opening/closing means outputs the voltage stored in the capacitor by opening/closing at times according to a pulse width of the pulse width control signal.

3. A BTL amplifier device as claimed in claim 1, wherein the negative feedback circuit has an operational amplifier, a voltage of one edge of the load is loaded to a non-inverting input terminal of the operational amplifier, and a voltage of the load voltage detecting circuit is loaded to an inverting input terminal thereof.

4. A balanced transformer less (BTL) amplifier device comprising:

first and second amplifiers to which an input signal and a signal obtained by inverting the input signal are supplied respectively, the first and second amplifiers constituting a BTL circuit;

a power voltage supplying circuit for generating an output voltage according to a control signal and supplying the output voltage to the first and second amplifiers as a power voltage;

a load connected to between output terminals of the first and second amplifiers;

a load voltage detecting circuit for detecting voltages at both edges of the load;

a negative feedback circuit for negatively feeding back the output voltage from the load voltage detecting circuit to the input signal side of the BTL circuit;

an absolute value circuit for outputting an absolute value of the output voltage on the input signal side of the BTL circuit; and a control signal generating circuit for generating the control signal according to a difference between an output voltage from the absolute value circuit and an output voltage from the power voltage supplying circuit;

wherein the power voltage supplying circuit comprises:
a step-up type chopper circuit; wherein the chopper circuit comprises:
a DC voltage source;
a coil with one end thereof connected to one edge of the DC voltage source;
an opening/closing means connected to between the other end of the coil and the other edge of the DC voltage source;
a diode serially connected to between the other end of the coil and an output terminal to which the output voltage from the coil is guided and outputted; and
a capacitor for storing a back electromotive force generated in the coil connected to the output terminal as well as to the other edge of the DC voltage source;
wherein the control signal generating circuit generates a control signal with a pulse width as the control signal according to a difference between an output voltage from the absolute value circuit and an output voltage from the power voltage supplying circuit, and the opening/closing electromotive force on the voltage stored in the capacitor by opening/closing at times according to a pulse width of the pulse width control signal.

5. A balanced transformer less (BTL) amplifier device comprising:

first and second amplifiers to which an input signal and a signal obtained by inverting the input signal are supplied respectively, the first and second amplifiers constituting a BTL circuit;

a power voltage supplying circuit comprising a first power voltage generating circuit for generating a first power voltage and always supplying the first power voltage to the first and second amplifiers and a second power voltage generating circuit for generating a second power voltage according to a control signal and supplying a voltage obtained by adding the first power voltage to the second power voltage to the first and second amplifiers as a power voltage;

a load connected to between output terminals of the first and second amplifiers;

a load voltage detecting circuit for detecting voltages at both edges of the load;

a negative feedback circuit for negatively feeding back the output voltage from the load voltage detecting circuit to the input signal side of the BTL circuit;

an absolute value circuit for outputting an absolute value of the output voltage on the input signal side of the BTL circuit; and a control signal generating circuit for generating the control signal according to a difference between an output voltage from the negative feedback circuit and an output voltage from the power voltage supplying circuit.

6. A BTL amplifier device as claimed in claim 5, wherein said power voltage supplying circuit comprises:

first and second batteries serially connected to each other;

a diode with one edge thereof connected to a common connected point of said first and second batteries; and a semiconductor switch connected to between the other edge of said second battery opposite to said common connected point and the other edge of said diode; and said first battery constitutes said first power voltage generating circuit, and said second battery and said semiconductor switch constitute said second voltage generating circuit, and said semiconductor switch is opened or closed according to an output voltage from said control signal generating circuit controlled according to a difference between an output voltage from said absolute value circuit and an output voltage from said first battery.

7. A BTL amplifier device as claimed in claim 5, wherein said power voltage supplying circuit comprises:

a first battery;

a DC—DC convertor for receiving a voltage from said first battery as an input voltage;

a diode connected to one edge of said first battery; and a semiconductor switch connected to between an output terminal of said DC—DC convertor and the other edge of said diode; wherein the first battery constitutes said first power voltage generating circuit, said first battery, DC—DC convertor, and semiconductor switch constitute the second power voltage generating circuit, and said semiconductor switch is opened or closed according to an output voltage from said control signal generating circuit controlled according to a difference between an output voltage from said absolute value circuit and an output voltage from said first battery.

8. A BTL amplifier device as claimed in claim 5, wherein said power voltage supplying circuit comprises:

first and second batteries serially connected to each other;

a diode with one edge thereof connected to a common connected point of said first and second batteries; and a semiconductor variable resistance element connected to between the other edge of the second battery opposite to said common connected point and the other edge of said diode; wherein said first battery constitutes said first power voltage generating circuit, said second battery and said semiconductor variable resistance element constitute said second power voltage generating circuit, and a resistance value of said semiconductor variable resistance element is controlled according to an output voltage from said control signal generating circuit controlled according to a difference between an output voltage from said absolute value circuit and an output voltage from said first battery.

9. A BTL amplifier device as claimed in claim 5, wherein said power voltage supplying circuit comprises:

a first battery;

a DC—DC convertor for receiving a voltage of said first battery as an input voltage;

a diode connected to one edge of said first battery; and a semiconductor variable resistance element connected to between the output terminal of said DC—DC convertor and the other edge of said diode; wherein said first battery constitutes said first power voltage generating circuit, while said first battery, DC—DC convertor,and semiconductor variable resistance element constitute said second power voltage generating circuit, and a resistance value of said semiconductor variable resistance element is controlled according to an output voltage from said control signal generating circuit controlled according to a difference between an output voltage from said absolute value circuit and an output voltage from said first battery.

10. The BTL, amplifier device as claimed in claim 5, further comprising a frequency characteristics control circuit connected to a section between an output terminal of the negative feedback circuit and the absolute value circuit or to a section between the absolute value circuit and the control signal generating circuit and for increasing a high frequency component in an output voltage from the negative feedback circuit.

11. A BTL amplifier device as claimed in claim 5, further comprising a waveform shaping circuit for delaying a recovery time in an output voltage from the absolute value circuit to a value larger than an attack time for output.

12. A balanced transformer less (BTL) amplifier device comprising:
first and second amplifiers to which an input signal and a signal obtained by inverting the input signal are supplied respectively, the first and second amplifiers constituting a BTL circuit;
a power voltage supplying circuit for generating an output voltage according to a control signal and supplying the output voltage to the first and second amplifiers as a power voltage;
a load connected to between output terminals of the first and second amplifiers;
a load voltage detecting circuit for detecting voltages at both edges of the load;
a negative feedback circuit for negatively feeding back the output voltage from the load voltage detecting circuit to the input signal side of the BTL circuit;
an absolute value circuit for outputting an absolute value of the output voltage on the input signal side of the BTL circuit;
a control signal generating circuit for generating the control signal according to a difference between an output voltage from the absolute value circuit and an output voltage from the power voltage supplying circuit; and
a frequency characteristics control circuit connected to a section between an output terminal of the negative feedback circuit and the absolute value circuit or to a section between the absolute value circuit and the control signal generating circuit and for increasing a high frequency component in an output voltage from the negative feedback circuit.

13. A balanced transformer less (BTL) amplifier device comprising:
first and second amplifiers to which an input signal and a signal obtained by inverting the input signal are supplied respectively, the first and second amplifiers constituting a BTL circuit;
a power voltage supplying circuit for generating an output voltage according to a control signal and supplying the output voltage to the first and second amplifiers as a power voltage;
a load connected to between output terminals of the first and second amplifiers;
a load voltage detecting circuit for detecting voltages at both edges of the load;
a negative feedback circuit for negatively feeding back the output voltage from the load voltage detecting circuit to the input signal side of the BTL circuit;
an absolute value circuit for outputting an absolute value of the output voltage on the input signal side of the BTL circuit;
a control signal generating circuit for generating the control signal according to a difference between an output voltage from the absolute value circuit and an output voltage from the power voltage supplying circuit; and
a waveform shaping circuit for delaying a recovery time in an output voltage from the absolute value circuit to a value larger than an attack time for output.

14. A balanced transformer less (BTL) amplifier device comprising:
first and second amplifiers to which an input signal and a signal obtained by inverting the input signal are supplied respectively, the first and second amplifiers constituting a BTL circuit;
a power voltage supplying circuit for generating an output voltage according to a control signal and supplying the output voltage to the first and second amplifiers as a power voltage;
a load connected to between output terminals of the first and second amplifiers;
a load voltage detecting circuit for detecting voltages at both edges of the load;
a negative feedback circuit for negatively feeding back the output voltage from the load voltage detecting circuit to the input signal side of the BTL circuit;
an absolute value circuit for outputting an absolute value of the output voltage on the input signal side of the BTL circuit; and
a control signal generating circuit for generating the control signal according to a difference between an output voltage from the absolute value circuit and an output voltage from the power voltage supplying circuit;
wherein the power voltage supplying circuit comprises:
a step-up/step-down type of chopper circuit, and the chopper circuit comprises:
a DC voltage source;
an opening/closing means and a diode serially connected to each other between one edge of the DC voltage source and an output terminal to which the output voltage is guided and outputted;
a coil connected to a section between a point of connecting the opening/closing means to the diode and the other edge of the DC voltage source; and
a capacitor for storing a back electromotive force generated in the coil connected to between the output terminal and the other edge of the DC voltage source; wherein the control signal generating circuit generates a control signal with a pulse width according to a differential voltage between an output voltage from the absolute value circuit and an output voltage from the power voltage supplying circuit, and the opening/closing means outputs a voltage stored in the capacitor by opening and closing at times according to a pulse width of the pulse width control signal.

15. A balanced transformer less (BTL) amplifier device which comprises a plurality of BTL amplifiers comprising first and second amplifiers to which an input signal and a signal obtained by inverting the input signal are supplied respectively, the first and second amplifiers constituting a BTL circuit, and a load connected to between output terminals of the first and second amplifiers, wherein the device comprises:

a power voltage supplying circuit for generating an output voltage according to a control signal and supplying the output voltage to the first and second amplifiers in the plurality of BTL amplifiers;

a plurality of load voltage detecting circuits each for detecting voltages at both edges of each of the loads in the plurality of BTL amplifiers;

a plurality of negative feedback circuits each for negatively feeding back each of the voltages from the plurality of load voltage detecting circuits to the corresponding input signal side of the BTL amplifiers respectively;

a plurality of absolute value circuits each for outputting an absolute value of each of the output voltages from the plurality of corresponding input signal sides of said BTL amplifiers;

a maximum voltage detecting circuit for selecting the maximum voltage among output voltages from the plurality of absolute value circuits and outputting the selected voltage; and a control signal generating circuit for generating the control signal according to a differential voltage between an output voltage from the maximum voltage detecting circuit and an output voltage from the power voltage supplying circuit.

16. The BTL amplifier device as claimed in claim 15, wherein said maximum voltage detecting circuit is an OR circuit for receiving an output voltage from each of said plurality of absolute value circuits.

17. A balanced transformer less (BTL) amplifier device which comprises a plurality of BTL amplifiers comprising first and second amplifiers to which an input signal and a signal obtained by inverting the input signal are supplied respectively, the first and second amplifiers constitute a BTL circuit, and a load connected to between output terminals of the first and second amplifiers; wherein the device comprises:

a power voltage supplying circuit comprising a first power voltage generating circuit for generating a first power voltage and always supplying the first power voltage to the plurality of first and second amplifiers, and a second power voltage generating circuit for generating a second power voltage according to a control signal and supplying a voltage obtained by adding the first power voltage to the second power voltage to the plurality of first and second amplifiers as a power voltage;

a plurality of load voltage detecting circuits each for detecting voltages at both edges of each of the loads in the plurality of BTL amplifiers;

a plurality of negative feedback circuits each for negatively feeding back each of the voltages from the plurality of load voltage detecting circuits to the corresponding input signal side of the BTL amplifiers respectively;

a plurality of absolute value circuits each for outputting an absolute value of each of the output voltages from the plurality of corresponding input signal sides of the BTL amplifiers respectively;

a maximum voltage detecting circuit for selecting the maximum voltage among output voltages from the plurality of absolute value circuits and outputting the selected voltage; and a control signal generating circuit for generating the control signal according to a differential voltage between an output voltage from the maximum voltage detecting circuit and an output voltage from the power voltage supplying circuit.

18. The BTL amplifier device as claimed in claim 17, wherein said maximum voltage detecting circuit is an OR circuit for receiving an output voltage from each of said plurality of absolute value circuits.

* * * * *